(12) United States Patent
Frougier et al.

(10) Patent No.: US 11,894,361 B2
(45) Date of Patent: Feb. 6, 2024

(54) CO-INTEGRATED LOGIC, ELECTROSTATIC DISCHARGE, AND WELL CONTACT DEVICES ON A SUBSTRATE

(71) Applicant: INTERNATIONAL BUSINESS MACHINES CORPORATION, Armonk, NY (US)

(72) Inventors: Julien Frougier, Albany, NY (US); Sagarika Mukesh, Albany, NY (US); Anthony I. Chou, Guilderland, NY (US); Andrew M. Greene, Slingerlands, NY (US); Ruilong Xie, Niskayuna, NY (US); Veeraraghavan S. Basker, Schenectady, NY (US); Junli Wang, Slingerlands, NY (US); Effendi Leobandung, Stormville, NY (US); Jingyun Zhang, Albany, NY (US); Nicolas Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 22 days.

(21) Appl. No.: 17/545,501

(22) Filed: Dec. 8, 2021

(65) Prior Publication Data

US 2023/0178539 A1 Jun. 8, 2023

(51) Int. Cl.
*H01L 27/02* (2006.01)
*H01L 21/8234* (2006.01)
(Continued)

(52) U.S. Cl.
CPC .. *H01L 27/0255* (2013.01); *H01L 21/823481* (2013.01); *H01L 21/84* (2013.01);
(Continued)

(58) Field of Classification Search
CPC ......... H01L 27/0255; H01L 21/823481; H01L 21/84; H01L 27/0296; H01L 27/1207; H01L 27/1211
(Continued)

(56) References Cited

U.S. PATENT DOCUMENTS 8,093,121 B1   1/2012  Ransom et al.
9,865,589 B1   1/2018  Lee et al.
(Continued)

FOREIGN PATENT DOCUMENTS

EP   3675167 B1   6/2021

OTHER PUBLICATIONS

Wang et al., "Electrostatic Discharge Characteristics of SiGe Source/Drain PNN Tunnel FET", Electronics 2021, 10, 454. https://doi.org/10.3390/electronics10040454, Jan. 2021, pp. 1-9.

*Primary Examiner* — Thinh T Nguyen
(74) *Attorney, Agent, or Firm* — Tutunjian & Bitetto, P.C.; L. Jeffrey Kelly

(57) ABSTRACT

A semiconductor device is provided. The semiconductor device includes a first field effect device on a first region of a substrate, wherein a first gate structure and an electrostatic discharge device on a second region of the substrate, wherein a second gate structure for the electrostatic discharge device is separated from the substrate by the bottom dielectric layer, and a second source/drain for the electrostatic discharge device is in electrical contact with the substrate, wherein the second source/drain is doped with a second dopant type.

9 Claims, 26 Drawing Sheets

(51) Int. Cl.
*H01L 21/84* (2006.01)
*H01L 27/12* (2006.01)

(52) U.S. Cl.
CPC ...... *H01L 27/0296* (2013.01); *H01L 27/1207* (2013.01); *H01L 27/1211* (2013.01)

(58) Field of Classification Search
USPC ................................ 257/401; 438/284, 286
See application file for complete search history.

(56) References Cited

U.S. PATENT DOCUMENTS

| | | |
|---|---|---|
| 10,192,867 B1 | 1/2019 | Frougier et al. |
| 2020/0152619 A1* | 8/2020 | Anderson et al. .. H01L 27/0274 438/268 |
| 2020/0303502 A1 | 9/2020 | Bomberger et al. |
| 2021/0098470 A1 | 4/2021 | Fung |

* cited by examiner

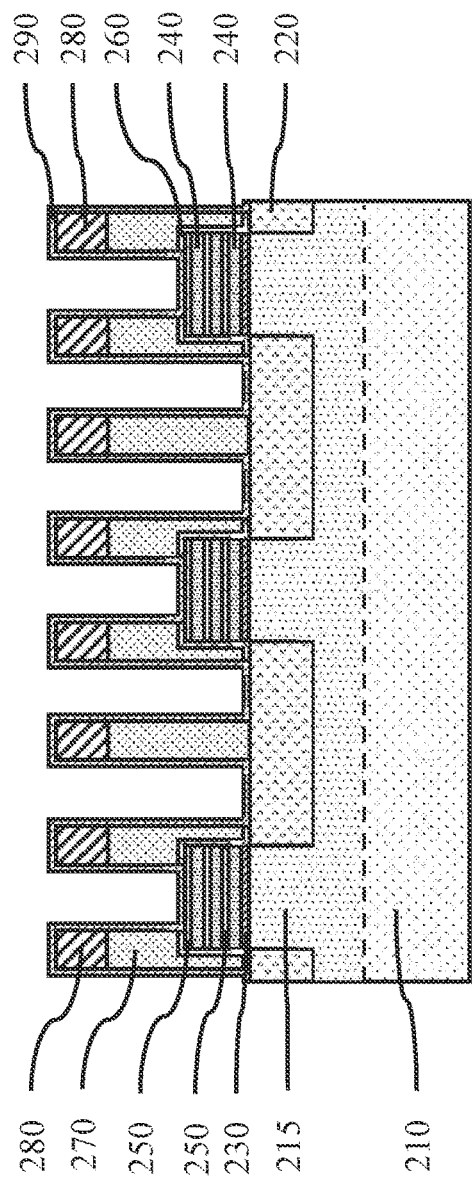
FIG. 4
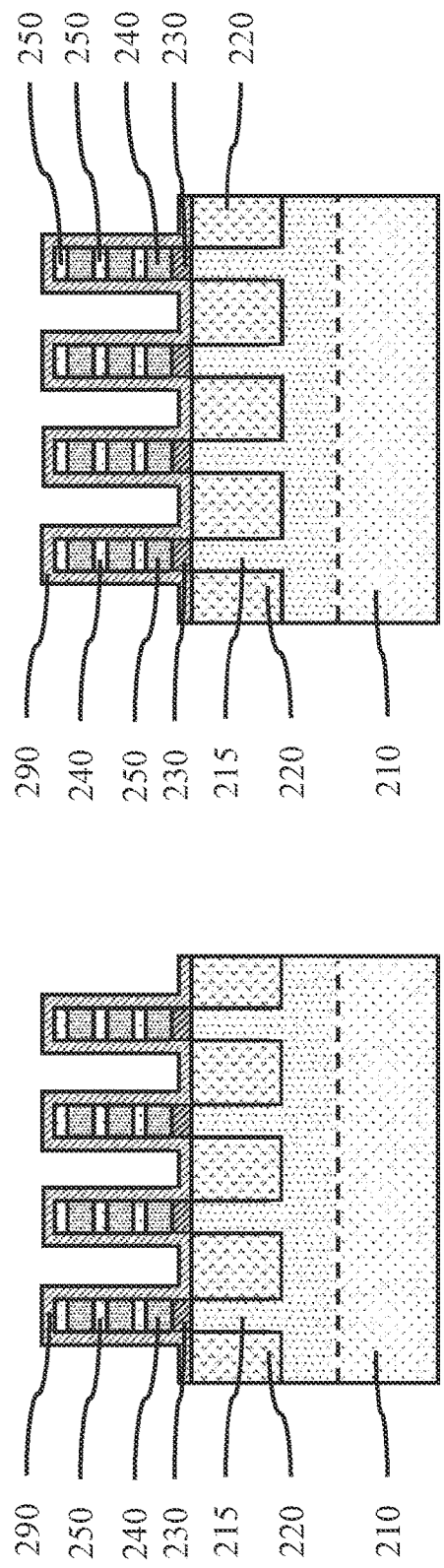
FIG. 5
FIG. 6

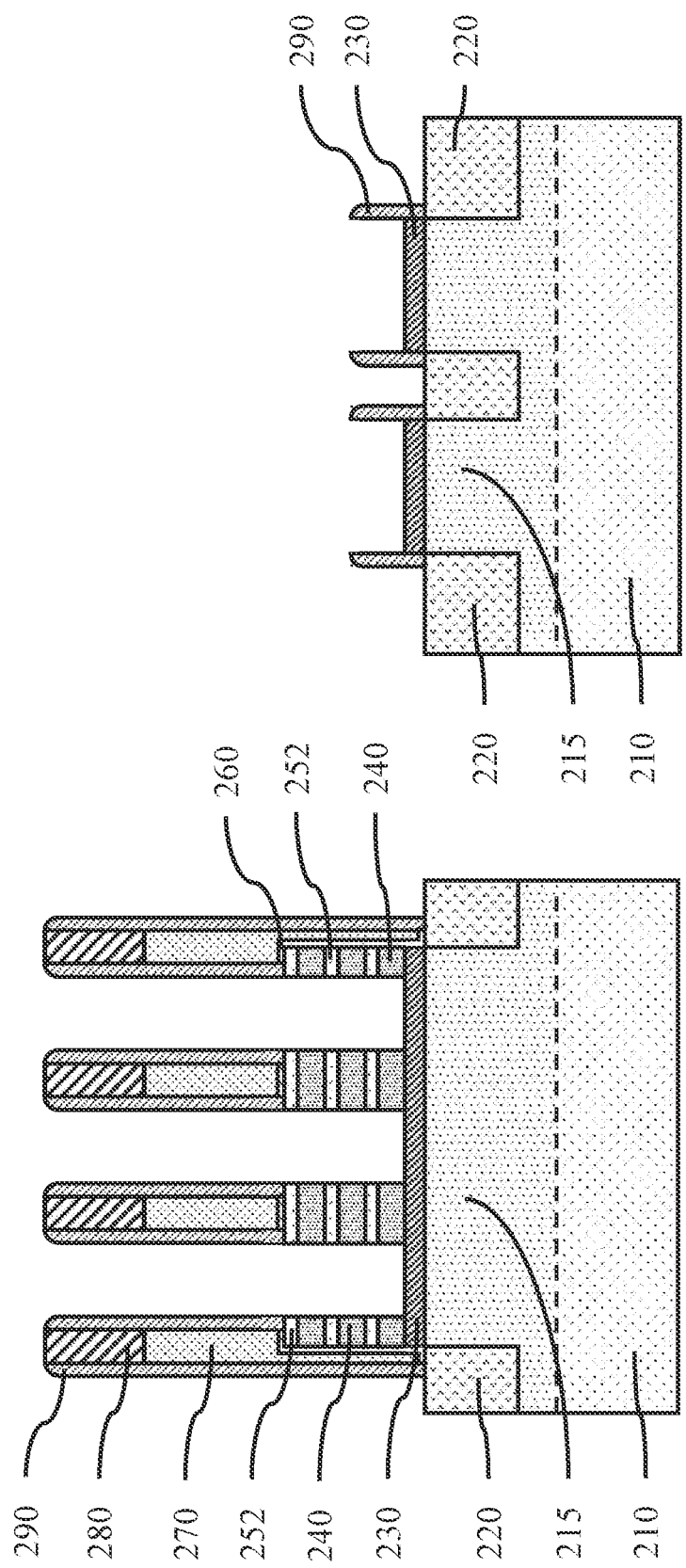

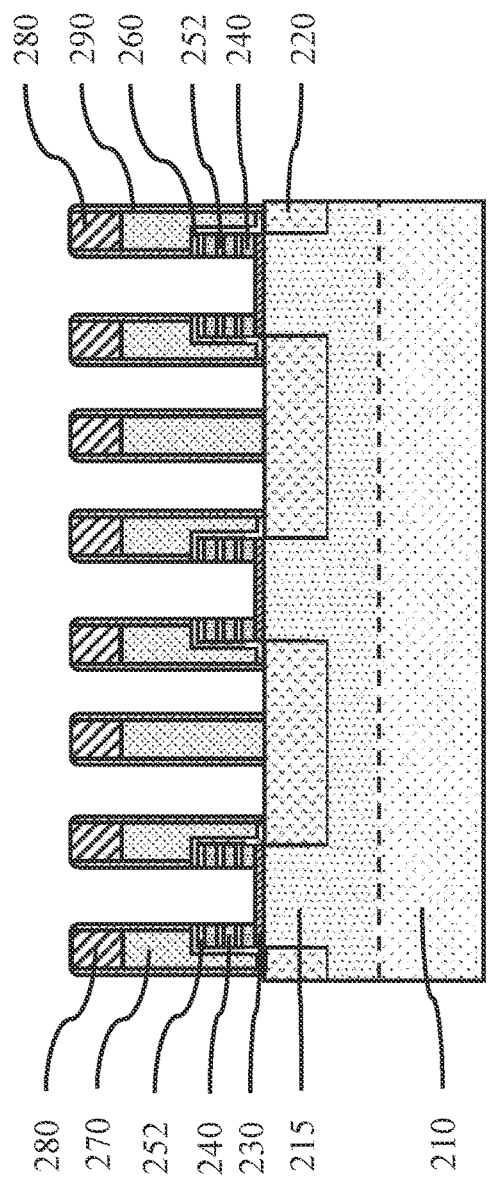
FIG. 9
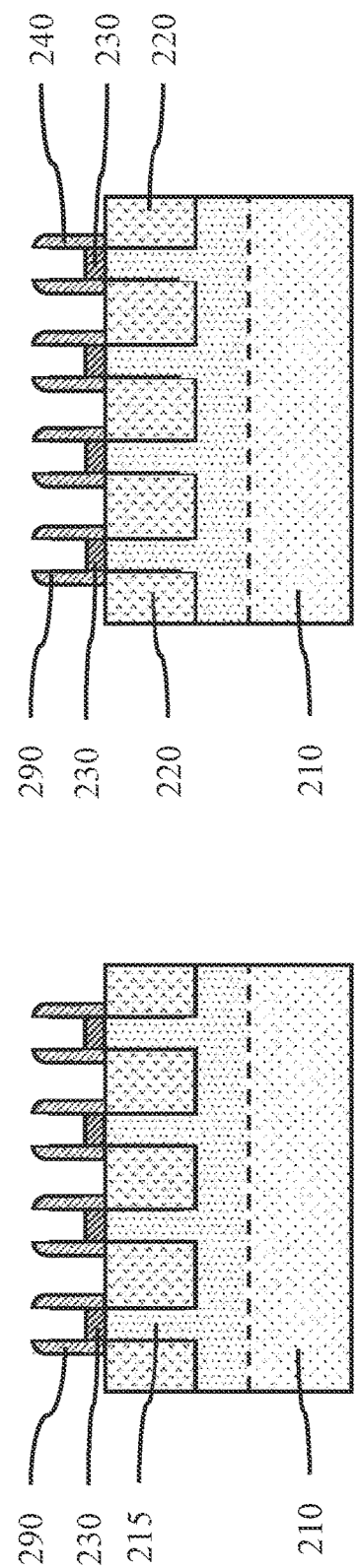
FIG. 11
FIG. 10

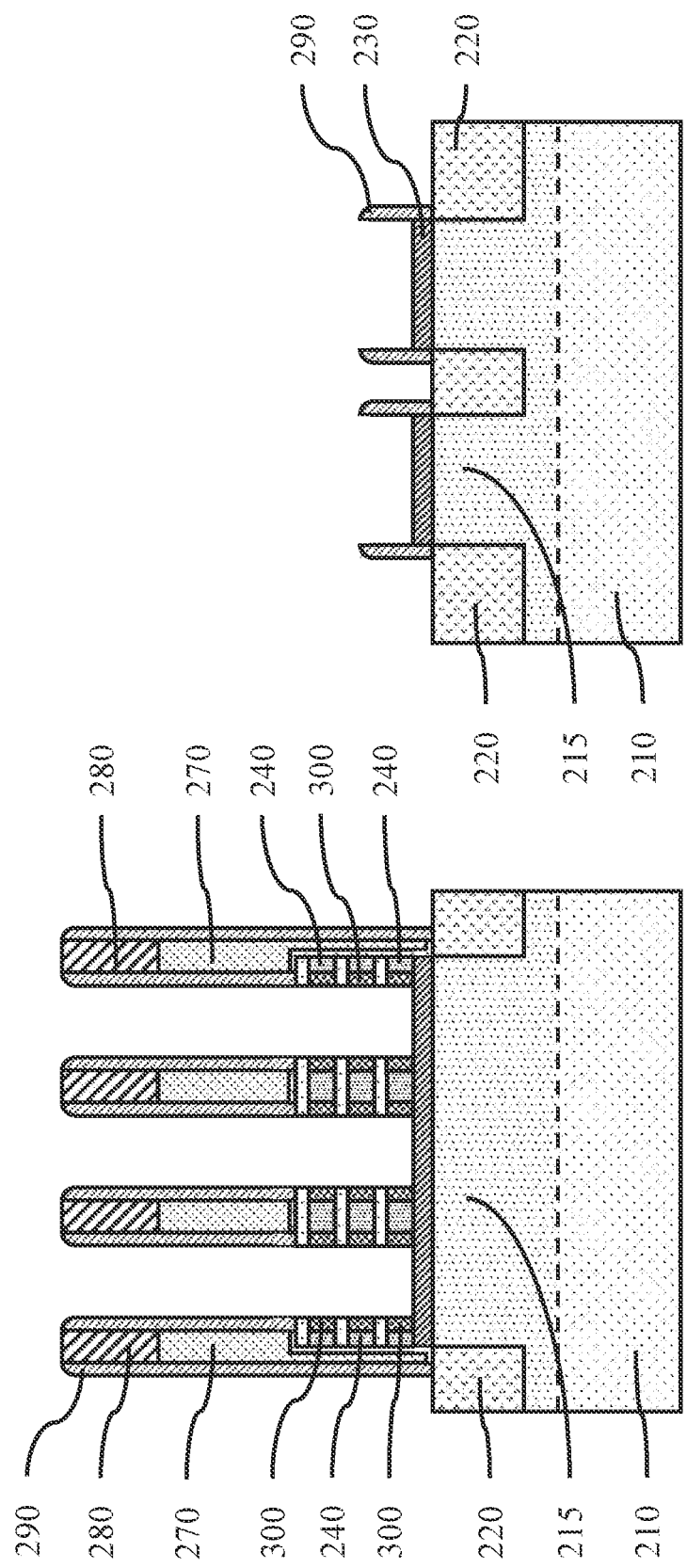

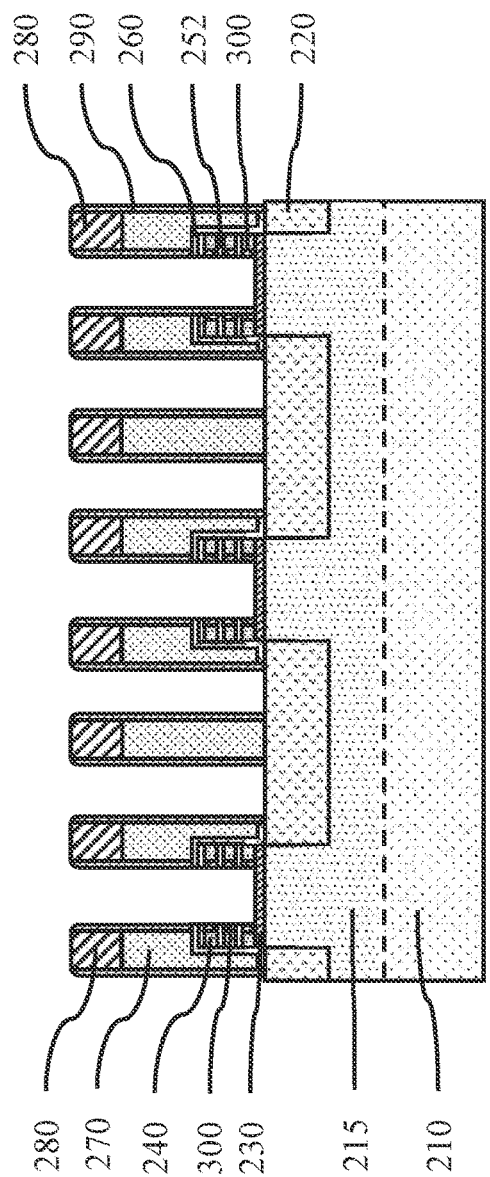
FIG. 14
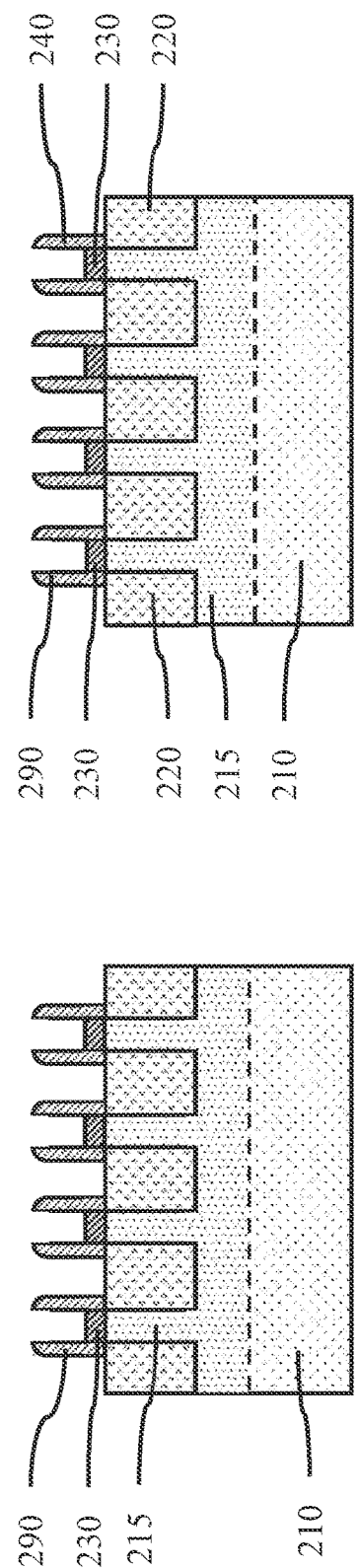
FIG. 15
FIG. 16

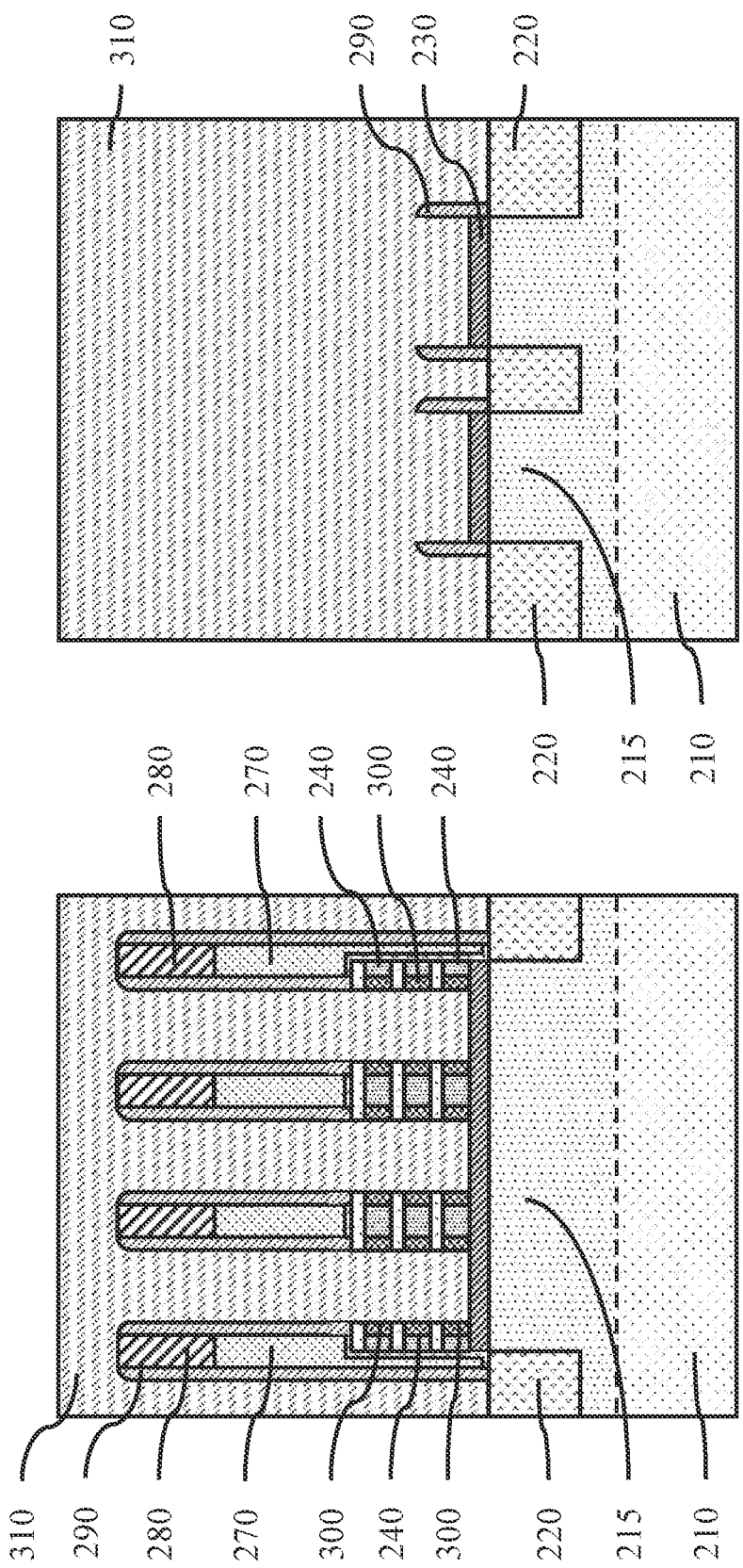

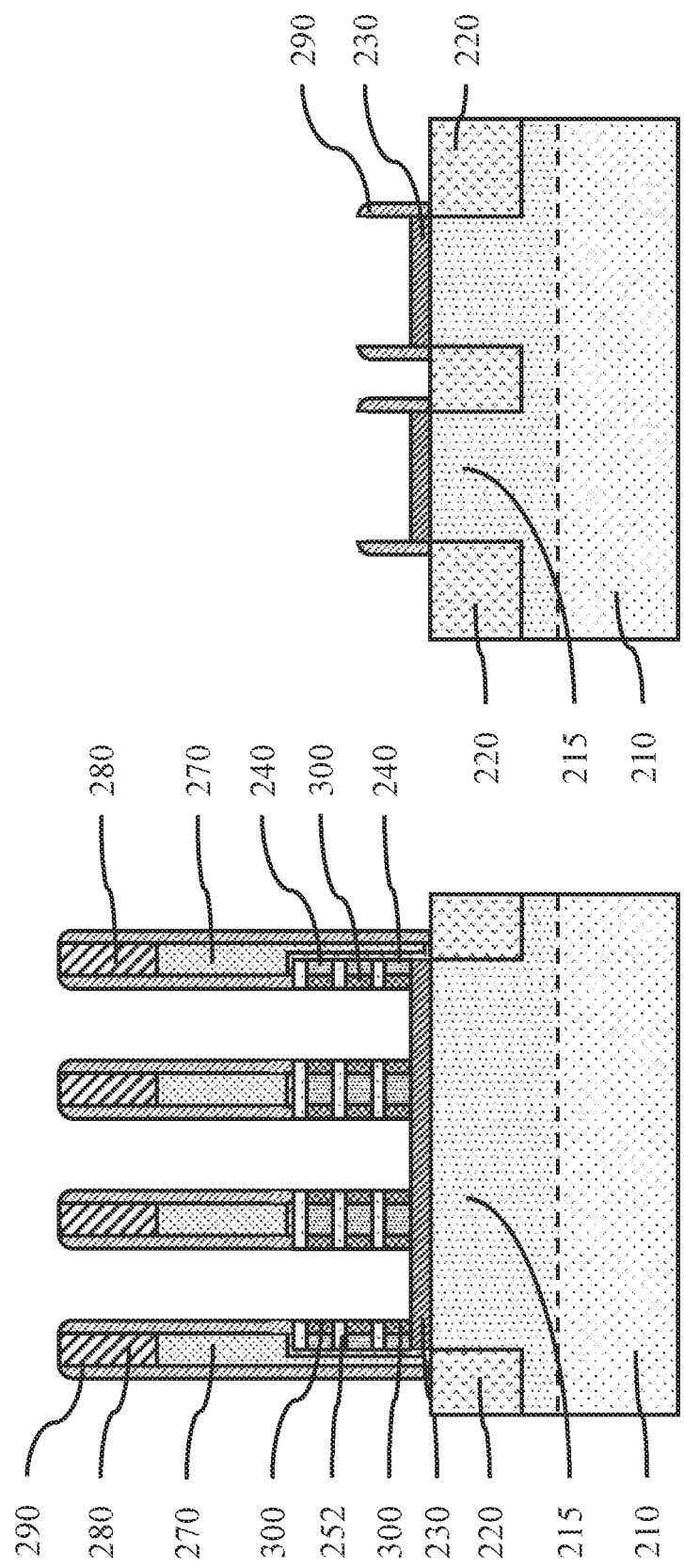

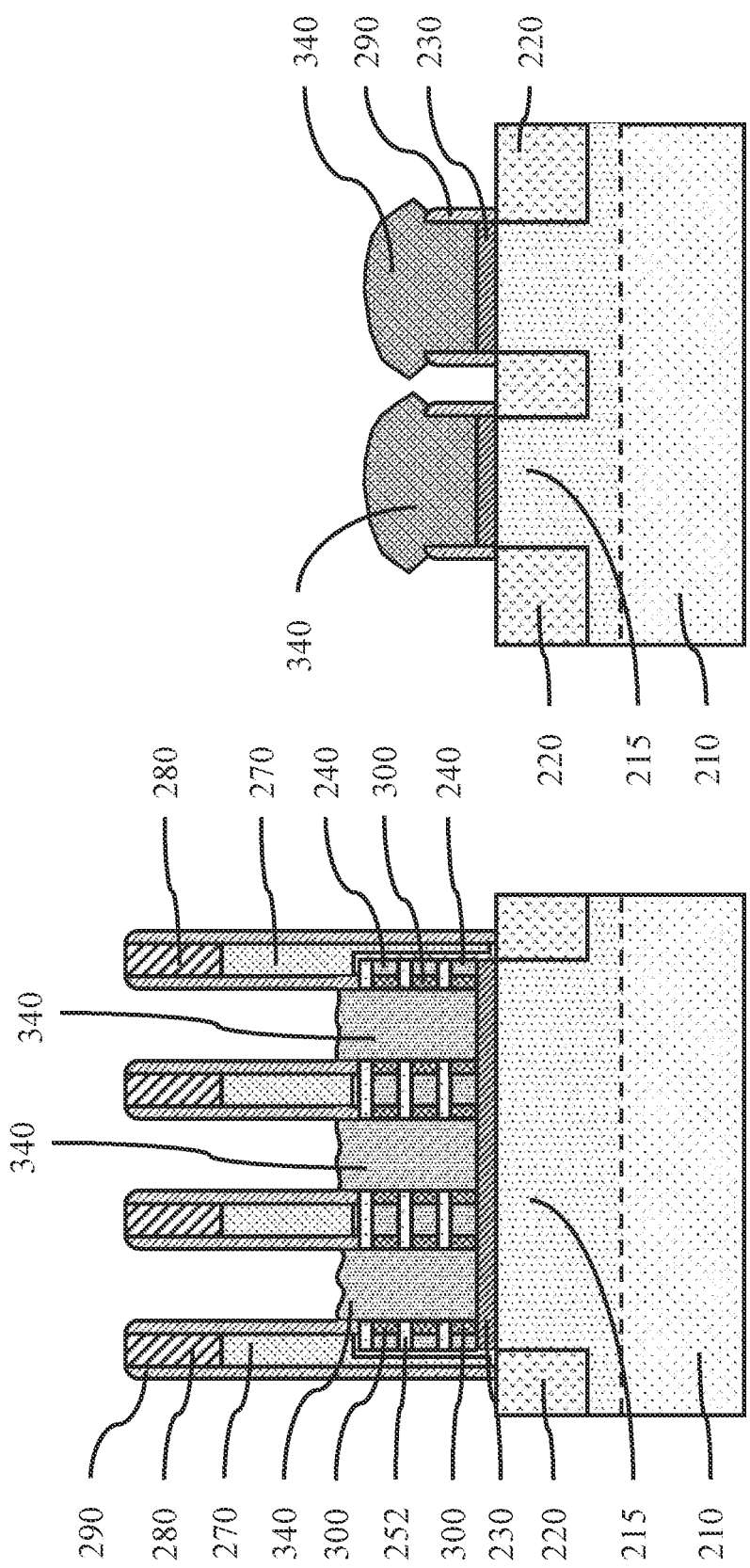

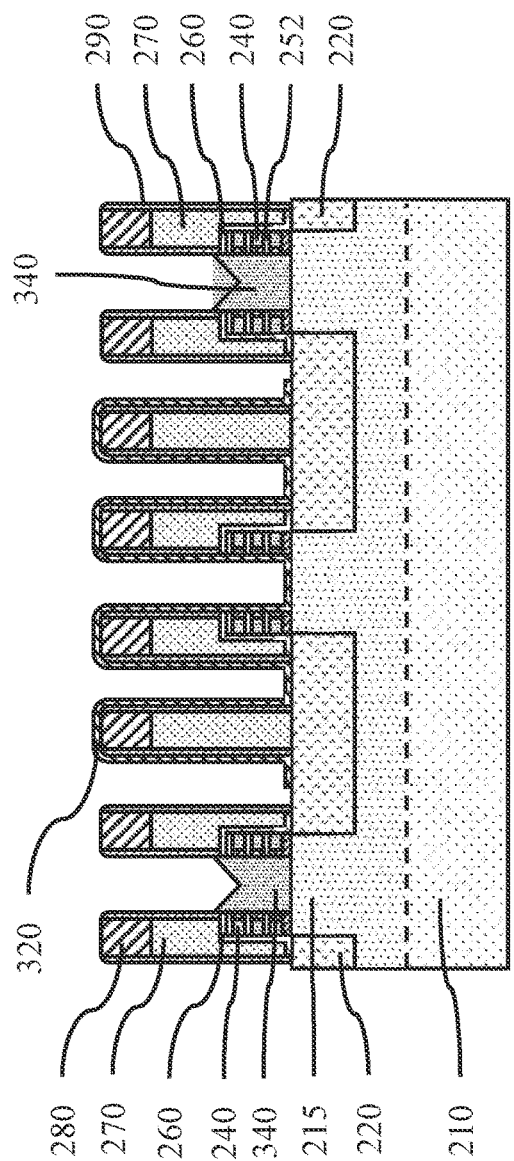
FIG. 34
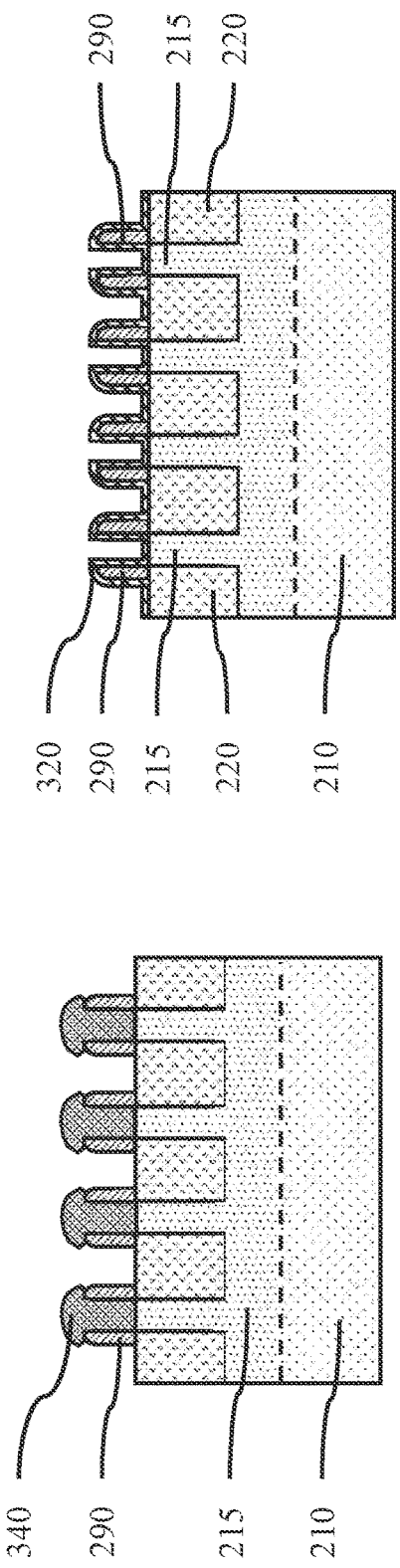
FIG. 35
FIG. 36

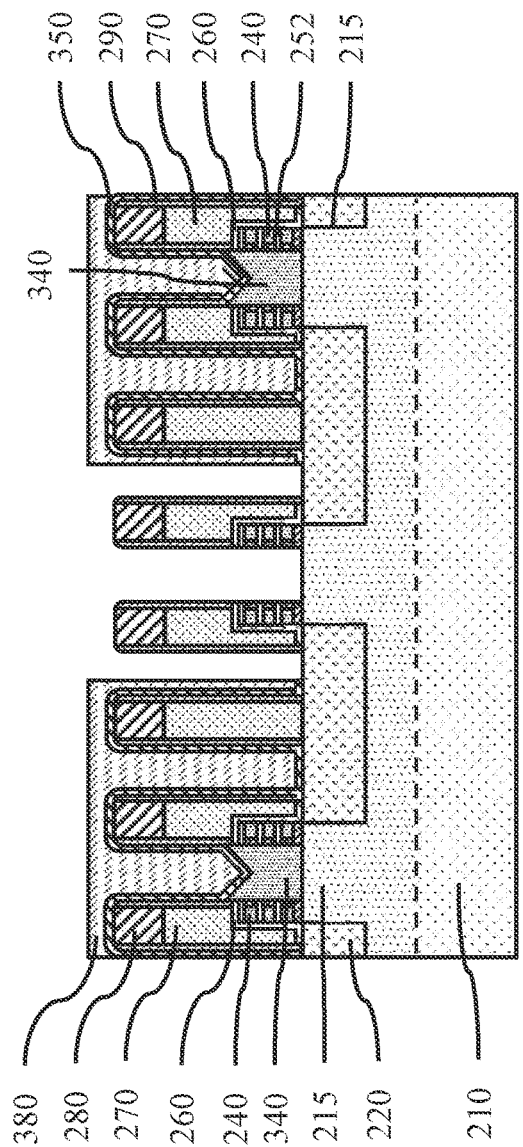
FIG. 39
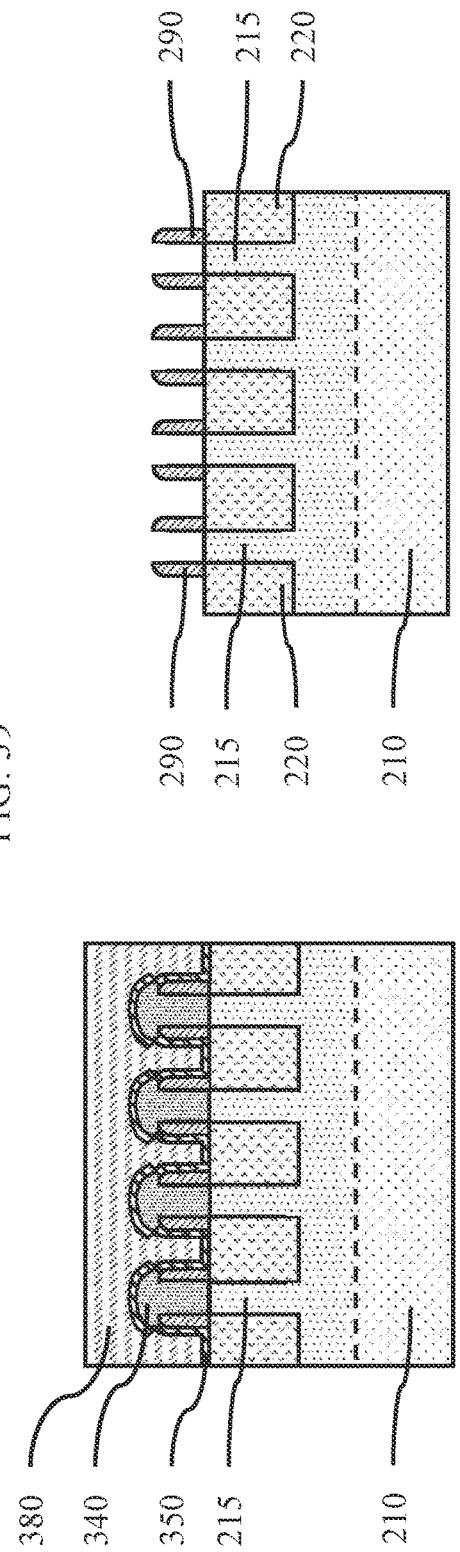
FIG. 41
FIG. 40

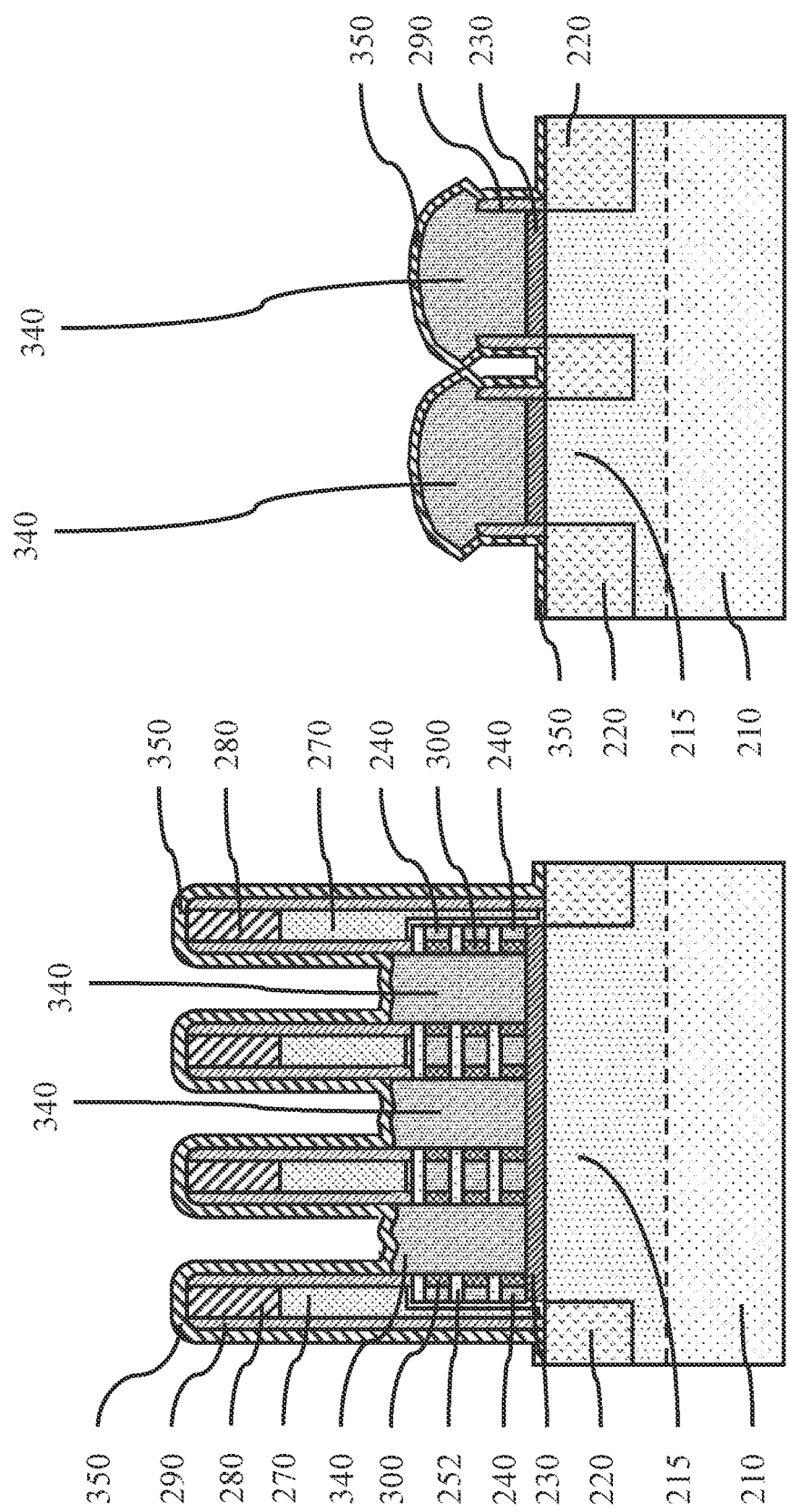

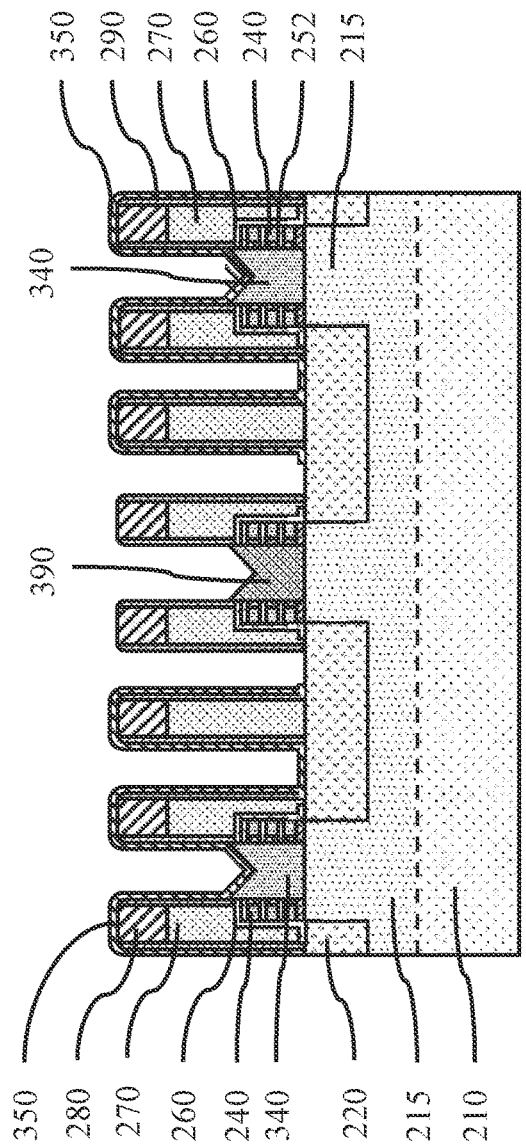
FIG. 44
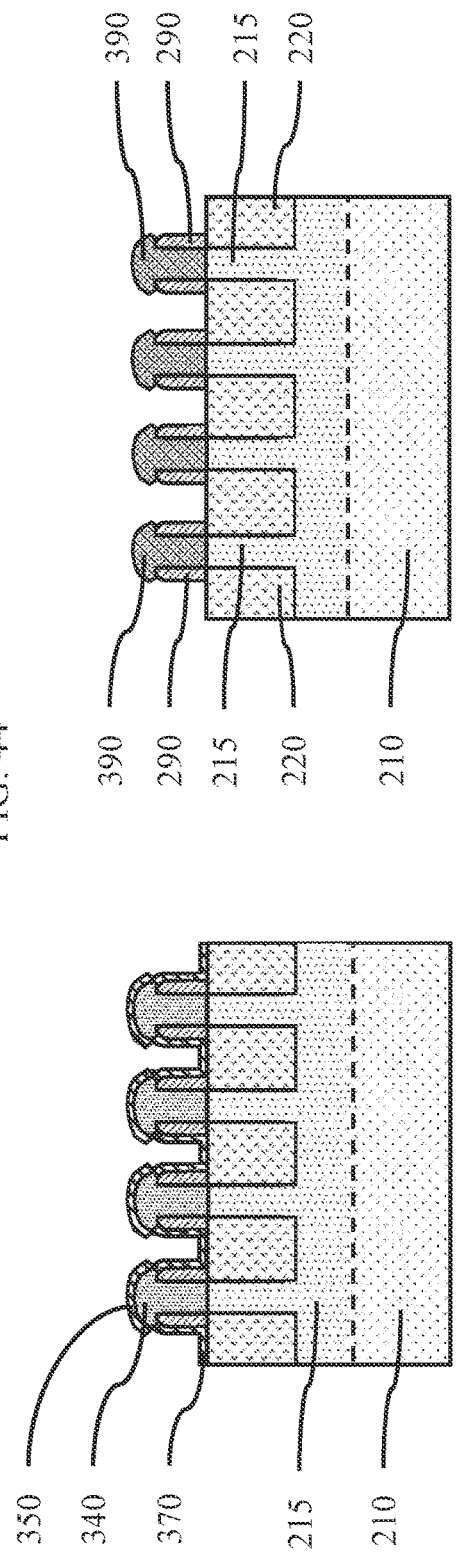
FIG. 46
FIG. 45

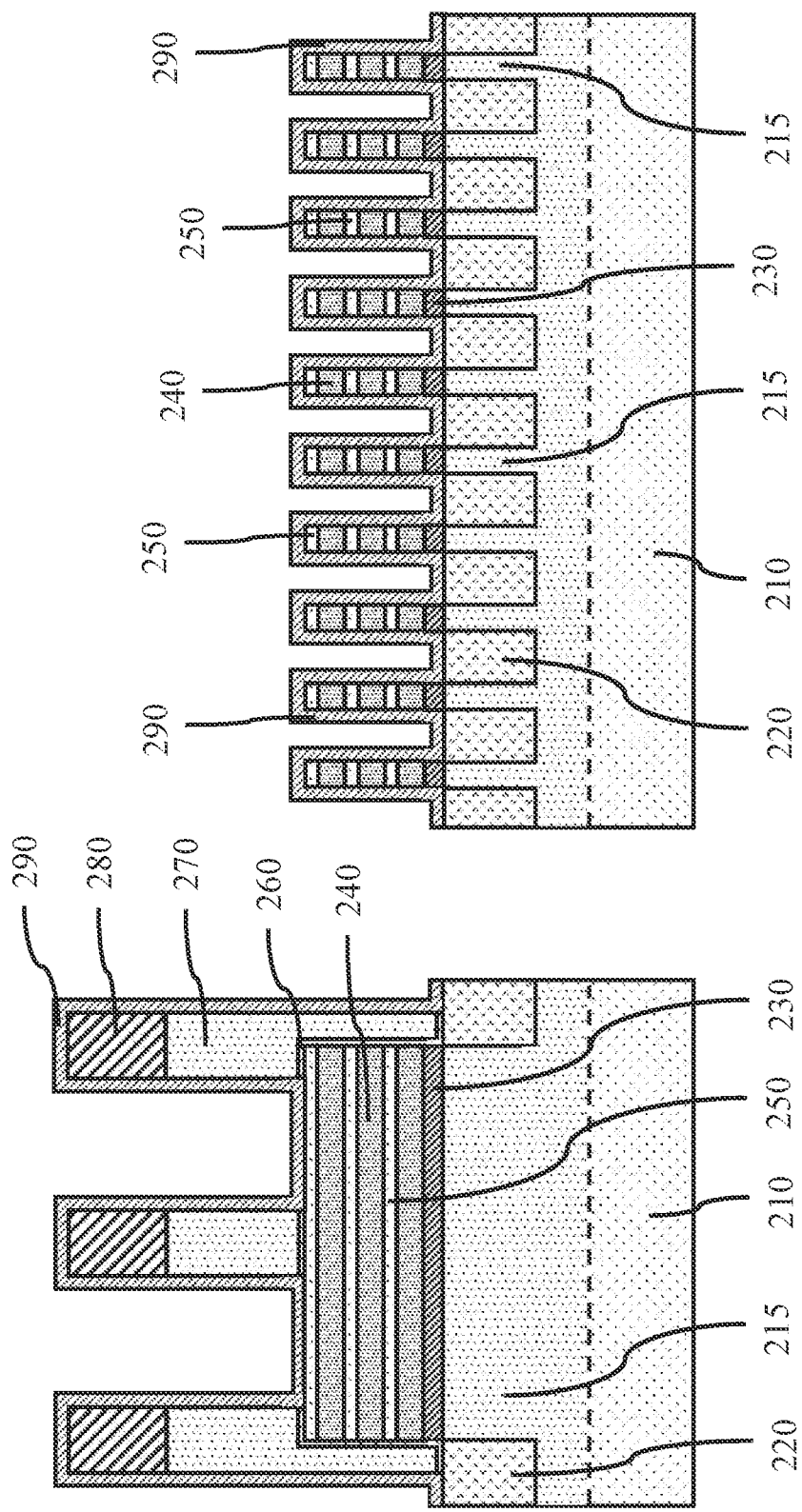

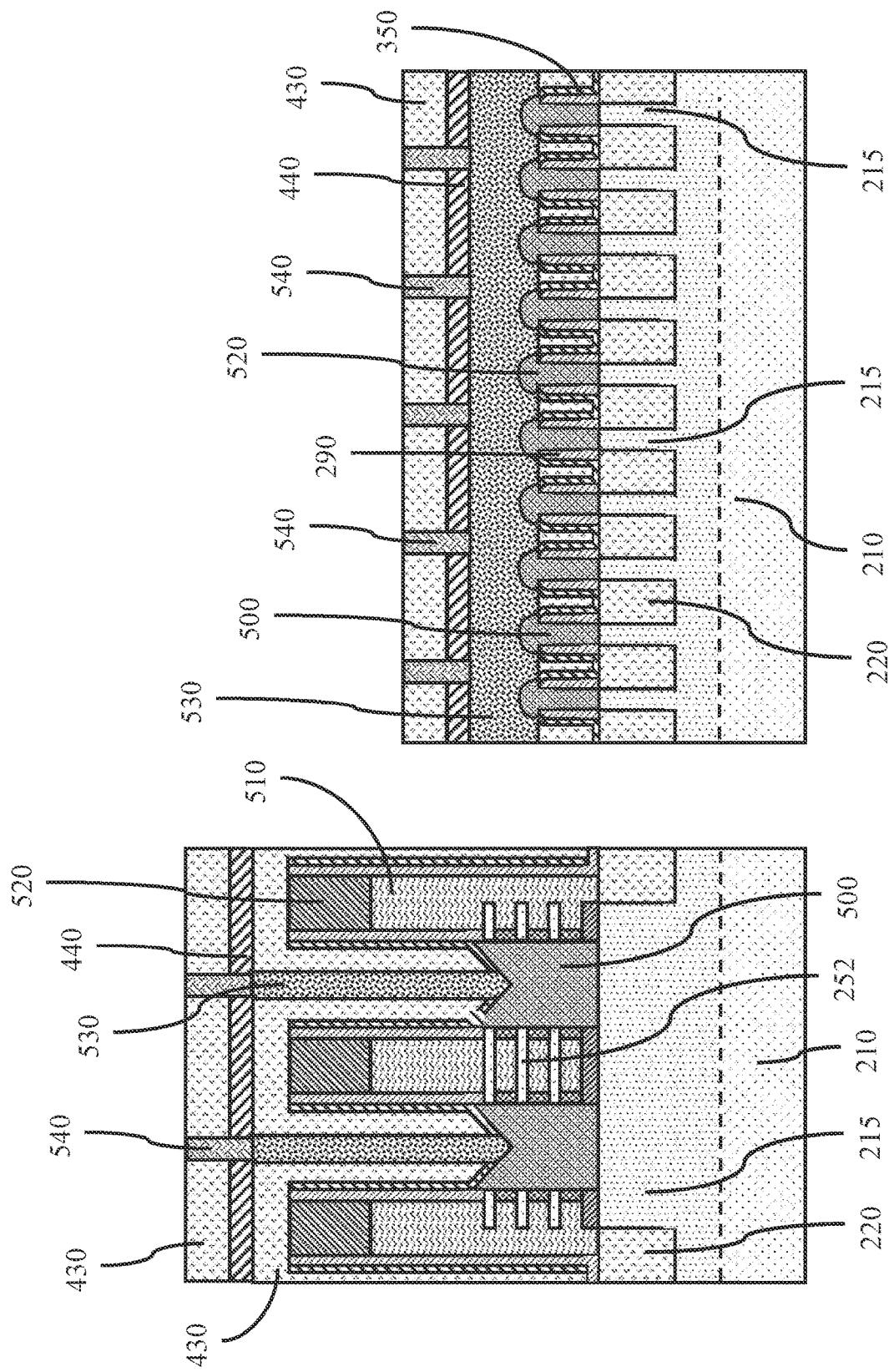

CO-INTEGRATED LOGIC, ELECTROSTATIC DISCHARGE, AND WELL CONTACT DEVICES ON A SUBSTRATE

BACKGROUND

The present invention generally relates to co-integrated logic, electrostatic discharge (ESD), and well-contact devices on a substrate, and more particularly to co-integrated nanosheet logic, electrostatic discharge (ESD), well-contact, and capacitor (CAP) devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows from a source to a drain. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a semiconductor device is provided. The semiconductor device includes a first field effect device on a first region of a substrate, wherein a first gate structure and an electrostatic discharge device on a second region of the substrate, wherein a second gate structure for the electrostatic discharge device is separated from the substrate by the bottom dielectric layer, and a second source/drain for the electrostatic discharge device is in electrical contact with the substrate, wherein the second source/drain is doped with a second dopant type.

In accordance with another embodiment of the present invention, a semiconductor device is provided. The semiconductor device includes a bottom dielectric insulating layer on a first region of a substrate, and one or more source/drains on the bottom dielectric insulating layer on the first region. The semiconductor device further includes a first set of one or more nanosheets in electrical contact with at least one of the one or more source/drains on the bottom dielectric insulating layer, and a first gate structure on the first set of one or more nanosheets. The semiconductor device further includes one or more source/drains on a second region of the substrate, wherein the source/drains on a second region are in electrical contact with the substrate, and a second set of one or more nanosheets in electrical contact with at least one of the one or more source/drains on the second region. The semiconductor device further includes a second gate structure on the second set of one or more nanosheets.

In accordance with yet another embodiment of the present invention, a method of forming a semiconductor device is provided. The method includes forming a bottom dielectric insulating layer on a substrate, and forming a stack of alternating sacrificial nanosheet layers and nanosheet channel layers on the bottom dielectric insulating layer on a first region, a second region, and a third region of the substrate. The method further includes forming a plurality of gate structures on the stack of alternating sacrificial nanosheet layers and nanosheet channel layers on the first region of the substrate, and forming a plurality of gate structures on the stack of alternating sacrificial nanosheet layers and nanosheet channel layers on the second region of the substrate. The method further includes forming a plurality of dummy gate structures on the stack of alternating sacrificial nanosheet layers and nanosheet channel layers on the third region of the substrate, and removing portions of the alternating sacrificial nanosheet layers and nanosheet channel layers from the first region, the second region, and the third region of the substrate that exposes the bottom dielectric insulating layer. The method further includes removing exposed portions of the bottom dielectric insulating layer from the second region and the third region of the substrate, and forming a first source/drain on the bottom dielectric insulating layer on the first region of the substrate. The method further includes forming a second source/drain on the substrate on the second region, and forming a third source/drain on the substrate on the third region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 4 is a cross-sectional side view along the C-C direction showing a plurality of gates on a nanosheet stack and substrate, in accordance with an embodiment of the present invention;

FIG. 5 is a cross-sectional side view along the D-D direction showing a nanosheet stack and substrate in an electrostatic discharge region, in accordance with an embodiment of the present invention;

FIG. 6 is a cross-sectional side view along the E-E direction showing a nanosheet stack and substrate in a well contact region, in accordance with an embodiment of the present invention;

FIG. 7 is a cross-sectional side view along the A-A direction showing the nanosheet stack partitioned to form nanosheet channels beneath each gate structure, in accordance with an embodiment of the present invention;

FIG. 8 is a cross-sectional side view along the B-B direction showing removal of a portion of the nanosheet stack between gate structures, in accordance with an embodiment of the present invention;

FIG. 9 is a cross-sectional side view along the C-C direction showing the nanosheet stacks partitioned to form nanosheet channels beneath each gate structure, in accordance with an embodiment of the present invention;

FIG. 10 is a cross-sectional side view along the D-D direction showing removal of the portion of the nanosheet stack between gate structures in the electrostatic discharge region, in accordance with an embodiment of the present invention;

FIG. 11 is a cross-sectional side view along the E-E direction showing removal of the portion of the nanosheet stack between gate structures in the well contact region, in accordance with an embodiment of the present invention;

FIG. 12 is a cross-sectional side view along the A-A direction showing replacement of a portion of the sacrificial nanosheets with inner spacers, in accordance with an embodiment of the present invention;

FIG. 13 is a cross-sectional side view along the B-B direction showing gate spacers and a portion of the dielectric insulating layer on the substrate, in accordance with an embodiment of the present invention;

FIG. 14 is a cross-sectional side view along the C-C direction showing replacement of a portion of the sacrificial nanosheets with inner spacers, in accordance with an embodiment of the present invention;

FIG. 15 is a cross-sectional side view along the D-D direction showing removal of the portion of the nanosheet stack between gate structures in the electrostatic discharge region, in accordance with an embodiment of the present invention;

FIG. 16 is a cross-sectional side view along the E-E direction showing removal of the portion of the nanosheet stack between gate structures in the well contact region, in accordance with an embodiment of the present invention;

FIG. 17 is a cross-sectional side view along the A-A direction showing a cover layer on the gate structures and dielectric insulating layer, in accordance with an embodiment of the present invention;

FIG. 18 is a cross-sectional side view along the B-B direction showing a cover layer on the gate spacers and a portion of the dielectric insulating layer, in accordance with an embodiment of the present invention;

FIG. 27 is a cross-sectional side view along the A-A direction showing removal of the protective liner from the gate structures and dielectric insulating layer, in accordance with an embodiment of the present invention;

FIG. 28 is a cross-sectional side view along the B-B direction showing a blocking layer on the dielectric insulating layer and nanosheet sidewalls, in accordance with an embodiment of the present invention;

FIG. 32 is a cross-sectional side view along the A-A direction showing source/drains formed on the dielectric insulating layer between the nanosheet channels and gate structures, in accordance with an embodiment of the present invention;

FIG. 33 is a cross-sectional side view along the B-B direction showing the source/drain on the dielectric insulating layer and nanosheet sidewalls, in accordance with an embodiment of the present invention;

FIG. 34 is a cross-sectional side view along the C-C direction showing a source/drain formed between the nanosheet channels and gate structures in the electrostatic discharge regions, in accordance with an embodiment of the present invention;

FIG. 35 is a cross-sectional side view along the D-D direction showing the source/drains formed on the nanosheet sidewalls in the electrostatic discharge region, in accordance with an embodiment of the present invention;

FIG. 36 is a cross-sectional side view along the E-E direction showing the protective liner on the nanosheet sidewalls in the well contact region, in accordance with an embodiment of the present invention;

FIG. 39 is a cross-sectional side view along the C-C direction showing the cover layer and insulating liner on the source/drains in the electrostatic discharge regions and removed from the gate structures in the well contact region, in accordance with an embodiment of the present invention;

FIG. 40 is a cross-sectional side view along the D-D direction showing the cover layer and insulating liner on the source/drains in the electrostatic discharge regions, in accordance with an embodiment of the present invention;

FIG. 41 is a cross-sectional side view along the E-E direction showing the protective liner removed from the nanosheet sidewalls in the well contact region, in accordance with an embodiment of the present invention;

FIG. 42 is a cross-sectional side view along the A-A direction showing the insulating liner on the source/drains and gate structures after removing the cover layer, in accordance with an embodiment of the present invention;

FIG. 43 is a cross-sectional side view along the B-B direction showing the insulating liner on the source/drains and nanosheet sidewalls, after removing the cover layer, in accordance with an embodiment of the present invention;

FIG. 44 is a cross-sectional side view along the C-C direction showing a source/drain formed between the nano sheet channels and gate structures in the well contact regions, in accordance with an embodiment of the present invention;

FIG. 45 is a cross-sectional side view along the D-D direction showing the source/drains between the nanosheet channels and gate structures in the electrostatic discharge regions, in accordance with an embodiment of the present invention;

FIG. 46 is a cross-sectional side view along the E-E direction showing the source/drains between the nanosheet channels and gate structures in the well contact region, in accordance with an embodiment of the present invention;

FIG. 57 is a cross-sectional side view along the C-C direction showing gate structures on the nanosheet stack, with the dielectric insulating layer in the regions, in accordance with another embodiment of the present invention;

FIG. 58 is a cross-sectional side view along the D-D direction showing the nanosheet stack, in accordance with another embodiment of the present invention;

FIG. 59 is a cross-sectional side view along the C-C direction showing a final structure for the nanosheet devices in the CAP region, in accordance with another embodiment of the present invention; and FIG. 60 is a cross-sectional side view along the D-D direction showing a final structure for the nanosheet devices in the CAP region, in accordance with another embodiment of the present invention.

DETAILED DESCRIPTION

Figure 1:
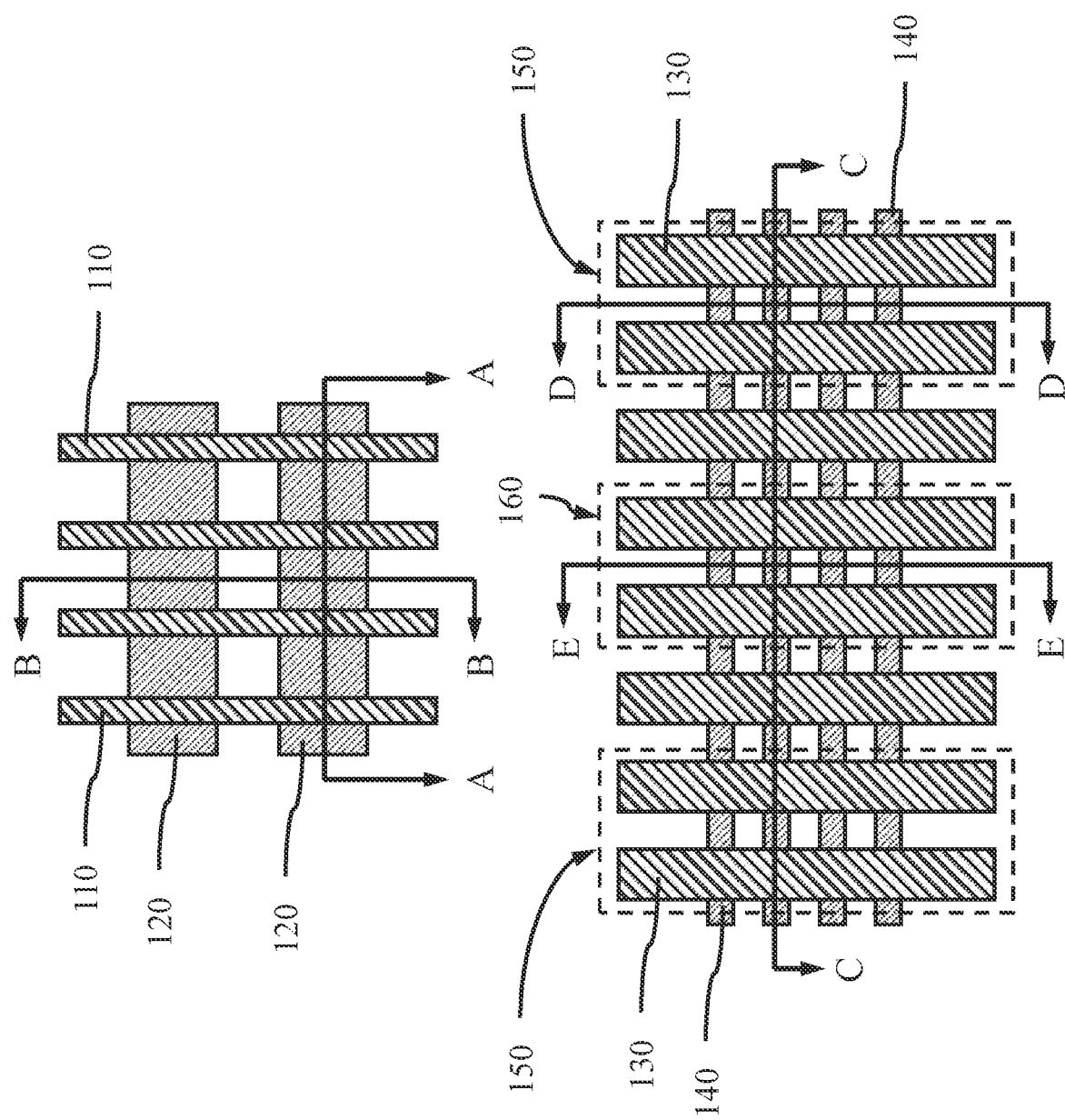
FIG. 1 is a top view showing a nanosheet device region along with an electrostatic discharge device region and an adjacent well contact region, in accordance with an embodiment of the present invention.

Embodiments of the present invention can provide a realistic, reliable and cost-effective solution for NS LOGIC/NS ESD-Well Contact co-integration. Nanosheet field effect devices and/or fin field effect devices can be formed on the same substrate to provide electrostatic discharged (ESD) hardened devices co-integrated with logic devices and well-contacted devices.

In various embodiments, nanosheet field effect transistor (NS FET) devices can be formed on a first region of a substrate and ESD devices can be formed on a second region of the substrate, where a dielectric insulating layer can electrically isolate the source/drains and gate regions of the NS FET devices from the substrate, and a dielectric insulating layer can electrically isolate the gate regions of the ESD devices and/or well-contact devices. The source/drains of the ESD devices and/or well-contact devices can be electrically connected to and/or in direct contact with the substrate.

Embodiments of the present invention can provide a logic device region, an ESD device region, and a well-contact device region on the same substrate, where the different regions can be adjacent to each other. Different device channel structures can be utilized in each of the different regions, where a nanosheet-type device channel may be used in the logic region and a fin-type device channel may be used in the ESD and/or well contact regions.

In various embodiments, an electrostatic discharge diode can be formed in the ESD region(s), where the ESD diode(s) can be configured to clamp the voltage to avoid damage to other circuit devices. The ESD diode(s) can have a doped source/drain in electrical contact with an oppositely doped substrate. The ESD diode(s) can have low diode reverse-bias leakage and capacitance for less parasitic loading, and low resistance and high forward-bias current capacity.

In various embodiments, a bottom dielectric insulating layer can be between the device channels and the substrate. A bottom dielectric insulating layer can be formed by replacing a bottom sacrificial layer with an electrically insulating dielectric layer beneath a nanosheet stack or vertical fin. Portions of the bottom dielectric insulating layer can be removed to allow electrical contact between the substrate and epitaxial source/drains.

Embodiments of the present invention can provide a realistic, reliable and cost-effective solution for NS LOGIC/n-type or p-type capacitors (CAP) co-integration. The NCAP/PCAP can have doped nanosheets or doped fins act as an electrical connection between the source/drains, where the NCAP can be an n-type capacitor exhibiting an n-type gate on an n-well and the PCAP can be a p-type capacitor exhibiting a p-type gate on a p-well.

Exemplary applications/uses to which the present invention can be applied include, but are not limited to: logic, electrostatic discharge (ESD), well-contact, and n/p-type capacitor (NCAP/PCAP) devices.

It is to be understood that aspects of the present invention will be described in terms of a given illustrative architecture; however, other architectures, structures, substrate materials and process features and steps can be varied within the scope of aspects of the present invention.

Referring now to the drawings in which like numerals represent the same or similar elements and initially to FIG. 1, FIG. 1 is a top view showing a nanosheet device region along with an electrostatic discharge device region and an adjacent well contact region, in accordance with an embodiment of the present invention.

In one or more embodiments, a plurality of gate structures 110 can be formed over a plurality of nanosheet channel stacks 120 in a nanosheet device region, which can form logic devices. In various embodiments, a plurality of nanosheet device stacks 140 can be formed across one or more electrostatic discharge device region(s) 150 and one or more well contact device region(s) 160. One or more gate structures 130 can be formed over the plurality of nanosheet device stacks 140 in each of the one or more electrostatic discharge device region(s) 150 and one or more well contact device region(s) 160. The nanosheet device region, electrostatic discharge device region(s) 150 and well contact device region(s) 160 can be on the same substrate, where the nanosheet device region, electrostatic discharge device region(s) 150 and well contact device region(s) 160 can be adjacent to each other.

Figures 2, 3:
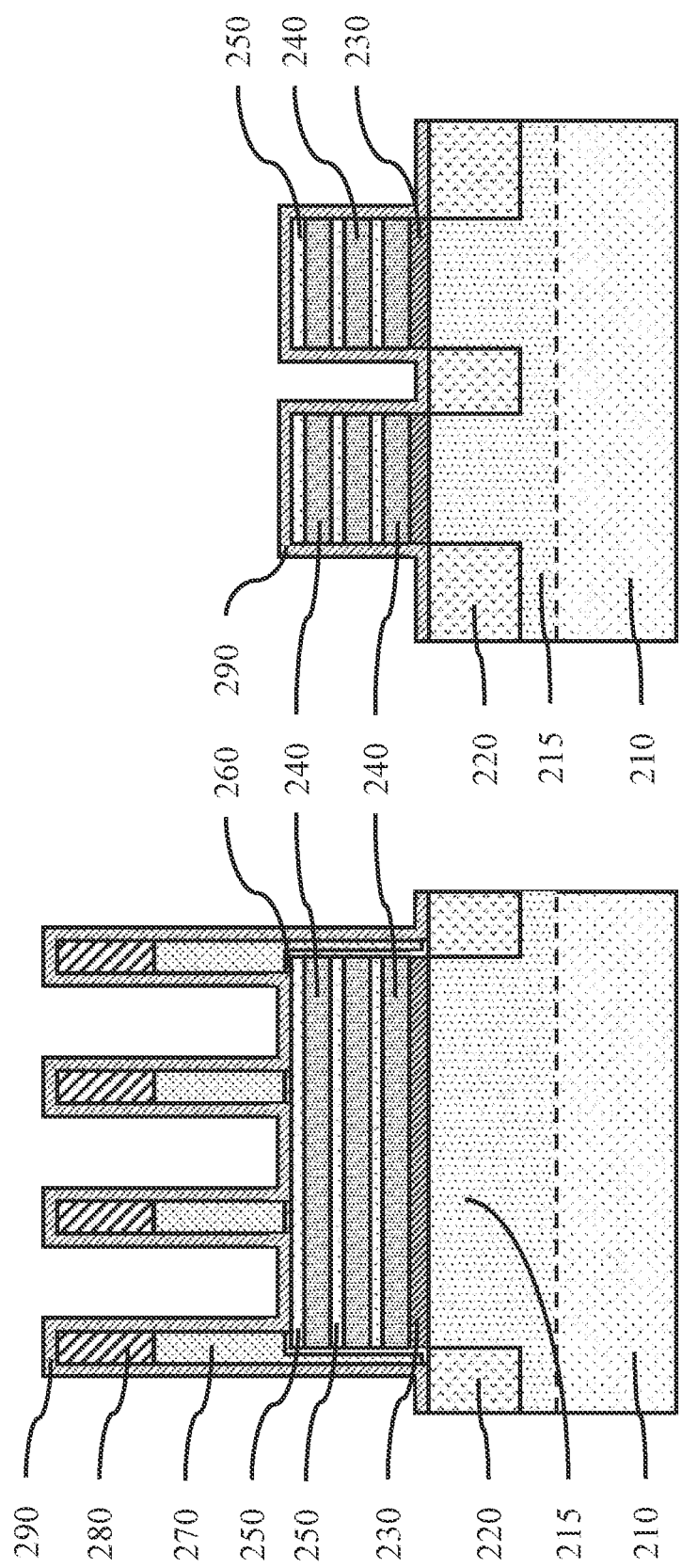
FIG. 2 is a cross-sectional side view along the A-A direction showing a plurality of gates on a nanosheet stack and substrate, in accordance with an embodiment of the present invention.
FIG. 3 is a cross-sectional side view along the B-B direction showing a nanosheet stack and substrate, in accordance with an embodiment of the present invention.

FIG. 2 is a cross-sectional side view along the A-A direction showing a plurality of gates on a nanosheet stack and substrate, in accordance with an embodiment of the present invention.

In one or more embodiments, the nanosheet devices in the nanosheet device region can be formed from a nanosheet stack of alternating sacrificial nanosheet layers 240 and nanosheet channel layers 250 formed on a substrate 210. A bottom dielectric insulating layer 230 can be formed on the substrate 210, where the bottom dielectric insulating layer 230 can be between the substrate 210 and the stack of alternating sacrificial nanosheet layers 240 and nanosheet channel layers 250. One or more electrical isolation regions 220 can be formed in the substrate 210, where the electrical isolation regions 220 be on opposite sides of the nanosheet stack.

In various embodiments, the nanosheet stack of alternating sacrificial nanosheet layers 240 and nanosheet channel layers 250 can be formed on a substrate 210 by epitaxial growth processes, where the substrate 210, sacrificial nanosheet layers 240, and nanosheet channel layers 250 can be semiconductor materials. The sacrificial nanosheet layers 240 can be a semiconductor material that can be selectively removed relative to the nanosheet channel layers 250, for example, the nanosheet channel layer 250 can be silicon (Si) and the sacrificial nanosheet layers 240 can be silicon germanium (SiGe) having a germanium concentration suitable to allow selective removal of the sacrificial nanosheet layers 240. In various embodiments, a selective etch rate can be an etch rate ratio of at least 100:1.

In various embodiments, the substrate 210 can be a semiconductor material, including, but not limited to, group IV semiconductors, for example, silicon (Si) and germanium (Ge), IV-IV compound semiconductors, for example, silicon carbide (Si) and silicon-germanium (SiGe), III-V semiconductors, for example, gallium nitride (GaN), gallium arsenide (GaAs), and indium phosphide (InP). The semiconductor substrate can be selected to provide a surface suitable for epitaxial growth.

In one or more embodiments, a doped well region 215 can be formed in the substrate 210, where a dopant can be introduced into the substrate material. The dopant can be an n-type dopant or a p-type dopant, where the dopant type can be the same as or opposite of a dopant for a device source/drain.

In various embodiments, the electrical isolation regions 220 can be an electrically insulating dielectric material, including, but not limited to, silicon oxide (SiO), silicon nitride (SiN), silicon oxynitride (SiON), silicon carbide (SiC), silicon carbonitride (SiCN), silicon boro carbonitride (SiBCN), and combinations thereof.

In various embodiments, the nanosheet channel layers 250 can have a thickness in a range of about 3 nanometers (nm) to about 15 nm, or about 4 nm to about 9 nm, although other thicknesses are also contemplated.

In various embodiments, the sacrificial nanosheet layers 240 can have a thickness in a range of about 6 nanometers (nm) to about 20 nm, or about 8 nm to about 15 nm, although other thicknesses are also contemplated.

In various embodiments, the bottom dielectric insulating layer 230 can be an electrically insulating dielectric material, including, but not limited to, silicon oxide (SiO), silicon nitride (SiN), silicon oxynitride (SiON), silicon carbide (SiC), silicon oxycarbide (SiOC), silicon carbonitride (SiCN), silicon boro carbonitride (SiBCN), silicon oxy carbonitride (SiOCN), and combinations thereof. The bottom dielectric insulating layer 230 can be formed by replacing a bottom most sacrificial layer beneath the alternating stack with the dielectric material through selective etching and a deposition.

In one or more embodiments, a plurality of dummy gate structures can be formed on the nanosheet stack, where each of the dummy gate structures can include a dummy gate 270 on the nanosheet stack, a dummy gate hardmask 280 on the dummy gate 270, and a gate spacer 290 formed over the dummy gate hardmask 280 and the dummy gate 270.

In various embodiments, a dummy gate dielectric 260 can cover the nanosheet stack, where the dummy gate dielectric 260 can be between the dummy gate 270 and a top most nanosheet channel layer 250. The gate spacer 290 can be on the top most nanosheet channel layer 250.

In various embodiments, the dummy gate dielectric 260 can be an electrically insulating dielectric material, including, but not limited to, silicon oxide (SiO), silicon nitride (SiN), silicon oxynitride (SiON), silicon carbide (SiC), silicon carbonitride (SiCN), silicon boro carbonitride (SiBCN), and combinations thereof.

In various embodiments, the dummy gate dielectric 260 can have a thickness in a range of about 0.5 nm to about 10 nm, or about 2 nm to about 4 nm, although other thicknesses are also contemplated.

In various embodiments, the dummy gate 270 can be a selectively removable material, for example, polycrystalline silicon (p-Si), amorphous silicon (a-Si), amorphous carbon (a-C), poly crystalline silicon germanium (p-SiGe), amorphous silicon-germanium (a-SiGe), and combinations thereof.

In various embodiments, the dummy gate hardmask 280 can be a dielectric hardmask material, including, but not limited to, silicon oxide (SiO), silicon nitride (SiN), silicon oxynitride (SiON), silicon carbide (SiC), silicon carbonitride (SiCN), silicon boro carbonitride (SiBCN), and combinations thereof. The dummy gate hardmask 280 can be a different material from the dummy gate dielectric 260 to allow selective removal of the dummy gate dielectric 260.

In various embodiments, the gate spacer 290 can be a dielectric low-k material, including, but not limited to, silicon oxide (SiO), silicon nitride (SiN), silicon oxynitride (SiON), silicon carbide (SiC), silicon oxycarbide (SiOC), silicon carbonitride (SiCN), silicon boro carbonitride (SiBCN), silicon oxy carbonitride (SiOCN), and combinations thereof. The gate spacer 290 can be a different dielectric material from each of the dummy gate hardmask 280 and bottom dielectric insulating layer 230 to allow selective removal of the layers.

In various embodiments, the gate spacer 290 can have a thickness in a range of about 3 nanometers (nm) to about 15 nm, or about 4 nm to about 9 nm, although other thicknesses are also contemplated.

FIG. 3 is a cross-sectional side view along the B-B direction showing a nanosheet stack and substrate, in accordance with an embodiment of the present invention.

In one or more embodiments, the nanosheet stack of alternating sacrificial nanosheet layers 240 and nanosheet channel layers 250 can be on the bottom dielectric insulating layer 230 and substrate 210. A sacrificial nanosheet layers 240 can be directly on the bottom dielectric insulating layer 230. One or more electrical isolation regions 220 can be formed in the substrate 210, where the electrical isolation regions 220 be on opposite sides of the nanosheet stack. The gate spacer 290 can be over the nanosheet stacks and on the electrical isolation regions 220.

FIG. 4 is a cross-sectional side view along the C-C direction showing a plurality of gates on a nanosheet stack and substrate, in accordance with an embodiment of the present invention.

In one or more embodiments, an ESD nanosheet stack, including alternating sacrificial nanosheet layers 240 and nanosheet channel layers 250, can be formed on a bottom dielectric insulating layer 230 in each electrostatic discharge region 150 and well contact regions 160.

FIG. 5 is a cross-sectional side view along the D-D direction showing a nanosheet stack and substrate in an electrostatic discharge region, in accordance with an embodiment of the present invention.

In one or more embodiments, an ESD nanosheet stack, including alternating sacrificial nanosheet layers 240 and nanosheet channel layers 250, can be formed on a bottom dielectric insulating layer 230 in each electrostatic discharge region.

FIG. 6 is a cross-sectional side view along the E-E direction showing a nanosheet stack and substrate in a well contact region, in accordance with an embodiment of the present invention.

In one or more embodiments, an well contact nanosheet stack, including alternating sacrificial nanosheet layers 240 and nanosheet channel layers 250, can be formed on a bottom dielectric insulating layer 230 in each well contact regions 160.

FIG. 7 is a cross-sectional side view along the A-A direction showing the nanosheet stack partitioned to form nanosheet channels beneath each gate structure, in accordance with an embodiment of the present invention.

In one or more embodiments, portions of the dummy gate dielectric 260 and alternating sacrificial nanosheet layers 240 and nanosheet channel layers 250 between the dummy gate structures can be removed by etching leaving other portions of the alternating sacrificial nanosheet layers 240 and nanosheet channels 252 beneath the gate spacer 290 and dummy gate 270. A portion of the dummy gate dielectric 260 can remain between the portions of the alternating sacrificial nanosheet layers 240 and nanosheet channels 252 and the dummy gate 270. The nanosheet stack can be recessed to form nano sheet source/drain region on each side of the gate structure, in accordance with an embodiment of the present invention.

FIG. 8 is a cross-sectional side view along the B-B direction showing removal of a portion of the nanosheet stack between gate structures, in accordance with an embodiment of the present invention.

In one or more embodiments, removal of portions of the dummy gate dielectric 260 and alternating sacrificial nanosheet layers 240 and nanosheet channel layers 250 between the dummy gate structures can leave the bottom dielectric insulating layer 230 and a portion of the gate spacer 290 on the substrate 210.

FIG. 9 is a cross-sectional side view along the C-C direction showing the nanosheet stacks partitioned to form nanosheet channels beneath each gate structure, in accordance with an embodiment of the present invention.

In one or more embodiments, portions of the ESD nanosheet stack, including alternating sacrificial nanosheet layers 240 and nanosheet channel layers 250 between the dummy gate structures can be removed by etching leaving other portions of the alternating sacrificial nanosheet layers 240 and nanosheet channels 252 beneath the gate spacer 290 and dummy gate 270. A portion of the dummy gate dielectric 260 can remain between the portions of the alternating sacrificial nanosheet layers 240 and nanosheet channels 252 and the dummy gate 270.

FIG. 10 is a cross-sectional side view along the D-D direction showing removal of the portion of the nanosheet stack between gate structures in the electrostatic discharge region, in accordance with an embodiment of the present invention.

In one or more embodiments, removal of portions of the dummy gate dielectric 260 and alternating sacrificial nanosheet layers 240 and nanosheet channel layers 250 between the dummy gate structures can leave the bottom dielectric insulating layer 230 and a portion of the gate spacer 290 on the substrate 210 in the electrostatic discharge region 150. The gate spacers 290 can be on the electrical isolation regions 220.

FIG. 11 is a cross-sectional side view along the E-E direction showing removal of the portion of the nanosheet stack between gate structures in the well contact region, in accordance with an embodiment of the present invention.

In one or more embodiments, removal of portions of the dummy gate dielectric 260 and alternating sacrificial nanosheet layers 240 and nanosheet channel layers 250 between the dummy gate structures can leave the bottom dielectric insulating layer 230 and a portion of the gate spacer 290 on the substrate 210 in the well contact region 160. The gate spacers 290 can be on the electrical isolation regions 220.

FIG. 12 is a cross-sectional side view along the A-A direction showing replacement of a portion of the sacrificial nanosheets with inner spacers, in accordance with an embodiment of the present invention.

In one or more embodiments, exposed portions of the sacrificial nanosheet layers 240 can be removed by etching to form recesses. An inner spacer 300 can be formed in the recesses in the sacrificial nanosheet layers 240. In various embodiments, the inner spacer 300 can be an electrically insulating dielectric material, including, but not limited to, silicon oxide (SiO), silicon nitride (SiN), silicon oxynitride (SiON), silicon carbide (SiC), silicon oxycarbide (SiOC), silicon carbonitride (SiCN), silicon boro carbonitride (SiBCN), silicon oxy carbonitride (SiOCN), and combinations thereof.

FIG. 13 is a cross-sectional side view along the B-B direction showing gate spacers and a portion of the dielectric insulating layer on the substrate, in accordance with an embodiment of the present invention.

In one or more embodiments, the bottom dielectric insulating layer 230 and a portion of the gate spacer 290 are on the substrate 210.

FIG. 14 is a cross-sectional side view along the C-C direction showing replacement of a portion of the sacrificial nanosheets with inner spacers, in accordance with an embodiment of the present invention.

In one or more embodiments, exposed portions of the sacrificial nanosheet layers 240 can be removed by etching to form recesses. An inner spacer 300 can be formed in the recesses in the sacrificial nanosheet layers 240.

FIG. 15 is a cross-sectional side view along the D-D direction showing removal of the portion of the nanosheet stack between gate structures in the electrostatic discharge region, in accordance with an embodiment of the present invention.

In one or more embodiments, the bottom dielectric insulating layer 230 and a portion of the gate spacer 290 are on the substrate 210.

FIG. 16 is a cross-sectional side view along the E-E direction showing removal of the portion of the nanosheet stack between gate structures in the well contact region, in accordance with an embodiment of the present invention.

In one or more embodiments, the bottom dielectric insulating layer 230 and a portion of the gate spacer 290 are on the substrate 210.

FIG. 17 is a cross-sectional side view along the A-A direction showing a cover layer on the gate structures and dielectric insulating layer, in accordance with an embodiment of the present invention.

In one or more embodiments, a cover layer 310 can be formed on the dummy gate structures, nanosheet stacks, and bottom dielectric insulating layer 230. In various embodiments, the cover layer 310 can be an organic planarization layer (OPL) that can be formed by a spin-on process.

FIG. 18 is a cross-sectional side view along the B-B direction showing a cover layer on the gate spacers and a portion of the dielectric insulating layer, in accordance with an embodiment of the present invention.

In one or more embodiments, a cover layer 310 can be formed on the gate spacer 290 and bottom dielectric insulating layer 230.

Figure 19:
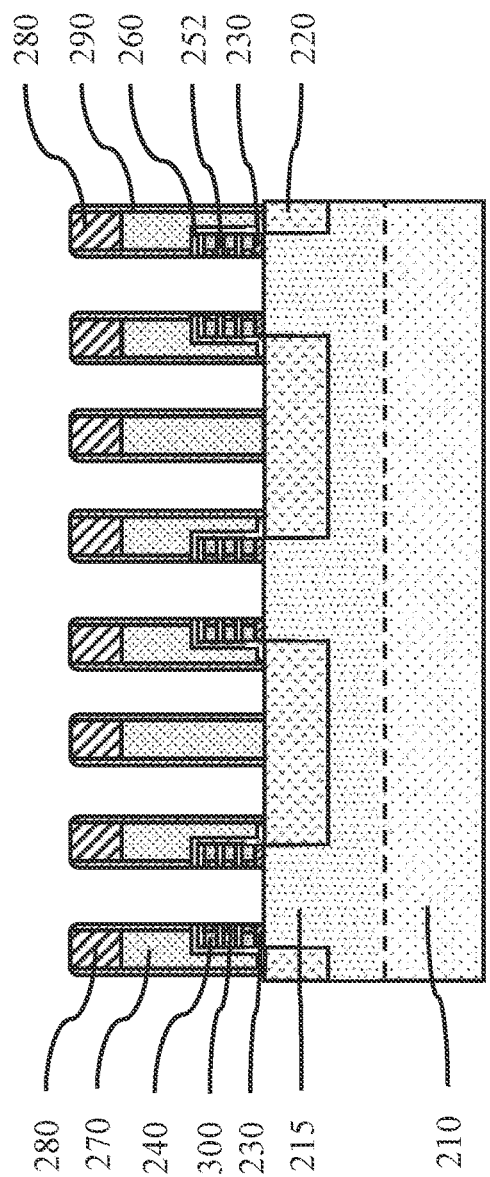
FIG. 19 is a cross-sectional side view along the C-C direction showing removal of exposed portions of the dielectric insulating layer between the gate structures, in accordance with an embodiment of the present invention.

FIG. 19 is a cross-sectional side view along the C-C direction showing removal of exposed portions of the dielectric insulating layer between the gate structures, in accordance with an embodiment of the present invention.

In one or more embodiments, the portion of the bottom dielectric insulating layer 230 can be removed from between the dummy gate structures using a selective directional etch (e.g., a reactive ion etch (RIE)) to expose a portion of the substrate 210.

Figure 20:
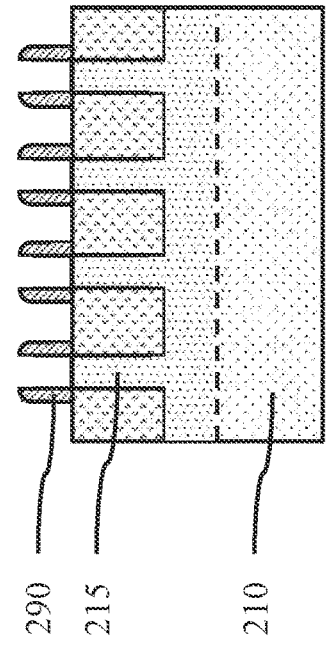
FIG. 20 is a cross-sectional side view along the D-D direction showing removal of exposed portions of the dielectric insulating layer between the gate structures in the electrostatic discharge region, in accordance with an embodiment of the present invention.

FIG. 20 is a cross-sectional side view along the D-D direction showing removal of exposed portions of the dielectric insulating layer between the gate structures in the electrostatic discharge region, in accordance with an embodiment of the present invention.

In one or more embodiments, the portion of the bottom dielectric insulating layer 230 can be removed from between the gate spacer 290 using a selective etch to expose a portion of the substrate 210.

Figure 21:
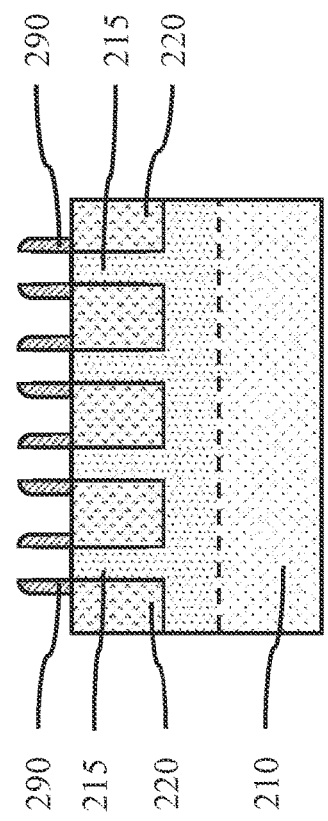
FIG. 21 is a cross-sectional side view along the E-E direction showing removal of exposed portions of the dielectric insulating layer between the gate structures in the well contact region, in accordance with an embodiment of the present invention.

FIG. 21 is a cross-sectional side view along the E-E direction showing removal of exposed portions of the dielectric insulating layer between the gate structures in the well contact region, in accordance with an embodiment of the present invention.

In one or more embodiments, the portion of the bottom dielectric insulating layer 230 can be removed from between the gate spacer 290 using a selective etch to expose a portion of the substrate 210.

Figures 22, 23:
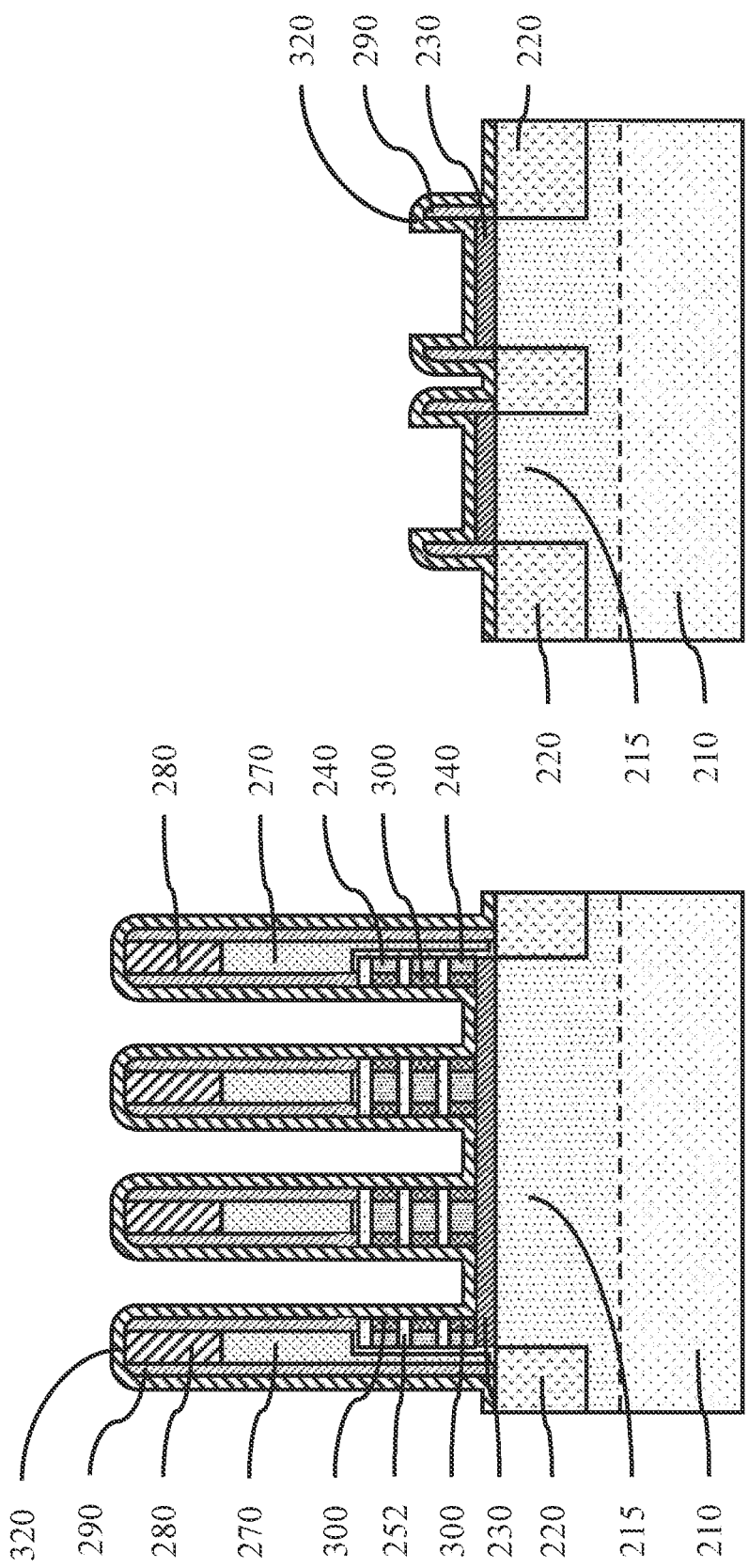
FIG. 22 is a cross-sectional side view along the A-A direction showing a protective liner on the gate structures and dielectric insulating layer, in accordance with an embodiment of the present invention.
FIG. 23 is a cross-sectional side view along the B-B direction showing the protective liner on the dielectric insulating layer and nanosheet sidewalls, in accordance with an embodiment of the present invention.

FIG. 22 is a cross-sectional side view along the A-A direction showing a protective liner on the gate structures and dielectric insulating layer, in accordance with an embodiment of the present invention.

In one or more embodiments, the cover layer 310 can be removed to expose the dummy gate structures, and a protective liner 320 can be formed on the dummy gate structures, electrical isolation regions 220, and bottom dielectric insulating layer 230.

In various embodiments, the protective liner 320 can be an electrically insulating dielectric material, including, but not limited to, silicon nitride (SiN), aluminum oxide (AlO), and combinations thereof.

In various embodiments, the protective liner 320 can have a thickness in a range of about 0.5 nm to about 10 nm, or about 2 nm to about 6 nm, although other thicknesses are also contemplated.

FIG. 23 is a cross-sectional side view along the B-B direction showing the protective liner on the dielectric insulating layer and nanosheet sidewalls, in accordance with an embodiment of the present invention.

In one or more embodiments, the cover layer 310 can be removed from the gate spacers 290 and bottom dielectric insulating layer 230, and a protective liner 320 can be formed on the gate spacers 290, electrical isolation regions 220, and bottom dielectric insulating layer 230.

Figure 24:
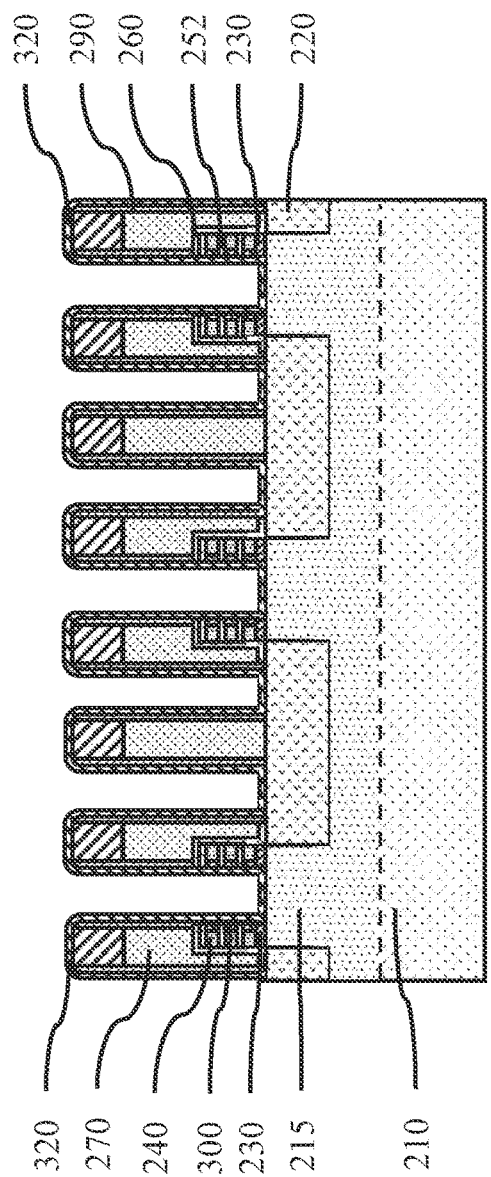
FIG. 24 is a cross-sectional side view along the C-C direction showing the protective liner on the gate structures and across the intervening surface, in accordance with an embodiment of the present invention.

FIG. 24 is a cross-sectional side view along the C-C direction showing the protective liner on the gate structures and across the intervening surface, in accordance with an embodiment of the present invention.

In one or more embodiments, the protective liner 320 can be formed on the dummy gate structures, electrical isolation regions 220, and the exposed surface of the substrate 210.

Figure 25:
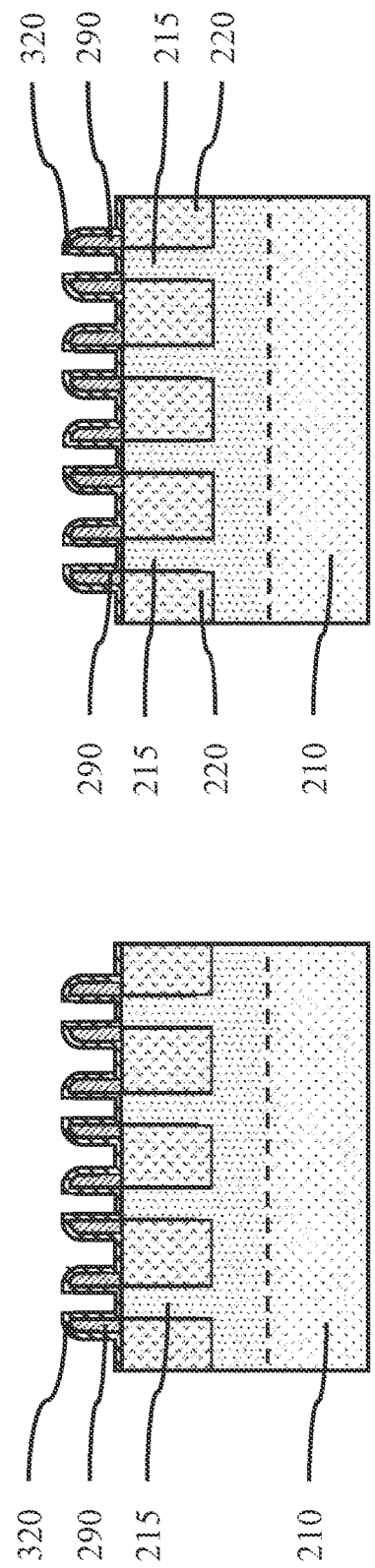
FIG. 25 is a cross-sectional side view along the D-D direction showing the protective liner on the dielectric insulating layer and nanosheet sidewalls in the electrostatic discharge region, in accordance with an embodiment of the present invention.

FIG. 25 is a cross-sectional side view along the D-D direction showing the protective liner on the dielectric insulating layer and nanosheet sidewalls in the electrostatic discharge region, in accordance with an embodiment of the present invention.

In one or more embodiments, the protective liner 320 can be formed on the gate spacers 290, electrical isolation regions 220, and exposed surface of the substrate 210.

Figure 26:
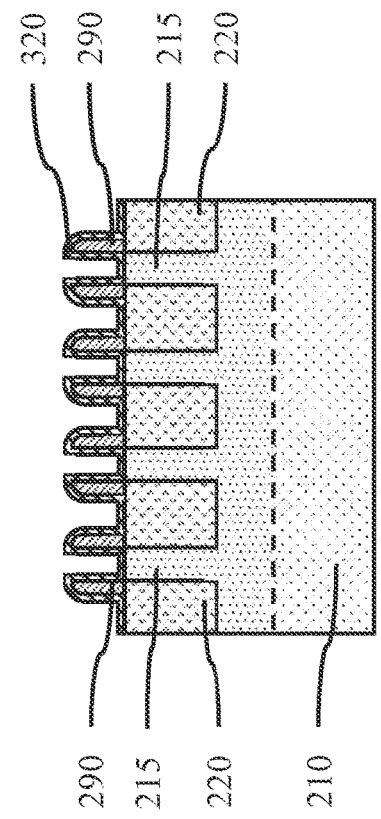
FIG. 26 is a cross-sectional side view along the E-E direction showing the protective liner on the dielectric insulating layer and nanosheet sidewalls in the well contact region, in accordance with an embodiment of the present invention.

FIG. 26 is a cross-sectional side view along the E-E direction showing the protective liner on the dielectric insulating layer and nanosheet sidewalls in the well contact region, in accordance with an embodiment of the present invention.

In one or more embodiments, the protective liner 320 can be formed on the gate spacers 290, electrical isolation regions 220, and exposed surface of the substrate 210.

FIG. 27 is a cross-sectional side view along the A-A direction showing removal of the protective liner from the gate structures and dielectric insulating layer, in accordance with an embodiment of the present invention.

In one or more embodiments, the protective liner 320 can be removed using a selective etch to expose the bottom dielectric insulating layer 230.

FIG. 28 is a cross-sectional side view along the B-B direction showing removal of the protective liner from the dielectric insulating layer and nanosheet sidewalls, in accordance with an embodiment of the present invention.

In one or more embodiments, the protective liner 320 can be removed using a selective etch to expose the bottom dielectric insulating layer 230.

Figure 29:
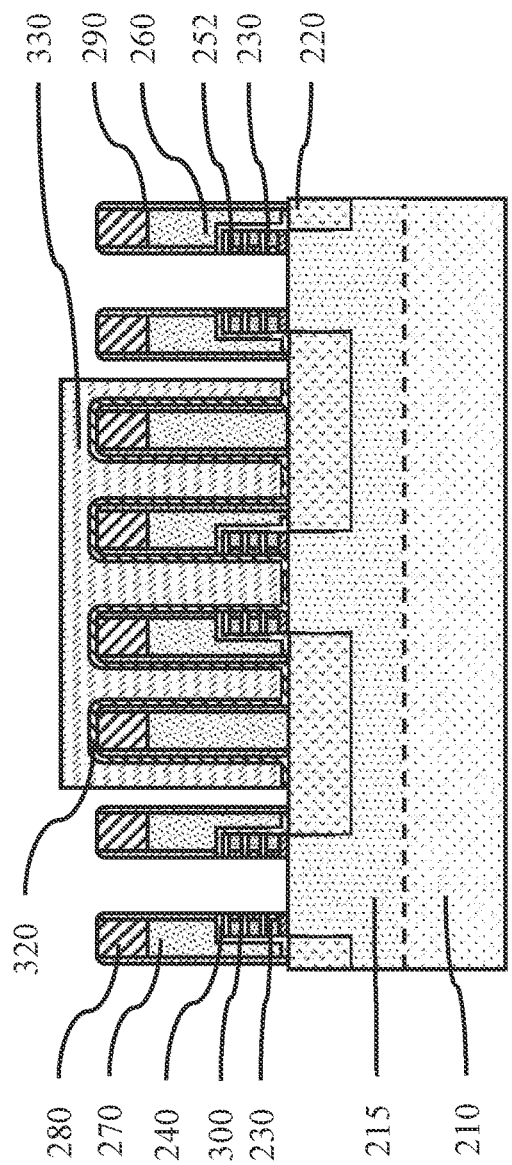
FIG. 29 is a cross-sectional side view along the C-C direction showing a blocking layer formed over the protective liner and gate structures in the well contact region, in accordance with an embodiment of the present invention.

FIG. 29 is a cross-sectional side view along the C-C direction showing a blocking layer formed over the protective liner and gate structures in the well contact region, in accordance with an embodiment of the present invention.

In one or more embodiments, a blocking layer 330 can be formed over the dummy gate structures in the well contact region 160, while the dummy gate structures in the ESD regions 150 remain exposed. The protective liner 320 can be removed from the dummy gate structures and substrate surface using a selective etch.

In various embodiments, the blocking layer 330 can be an organic planarization layer (OPL) that can be formed by a spin-on process and patterned through lithography and etching.

Figure 30:
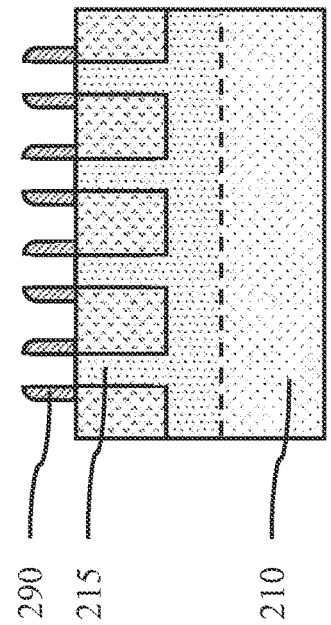
FIG. 30 is a cross-sectional side view along the D-D direction showing the nanosheet sidewalls in the electrostatic discharge region, in accordance with an embodiment of the present invention.

FIG. 30 is a cross-sectional side view along the D-D direction showing the nanosheet sidewalls in the electrostatic discharge region, in accordance with an embodiment of the present invention.

In one or more embodiments, the protective liner 320 can be removed from the gate spacers 290 and substrate surface in the ESD regions 150 using a selective etch.

Figure 31:
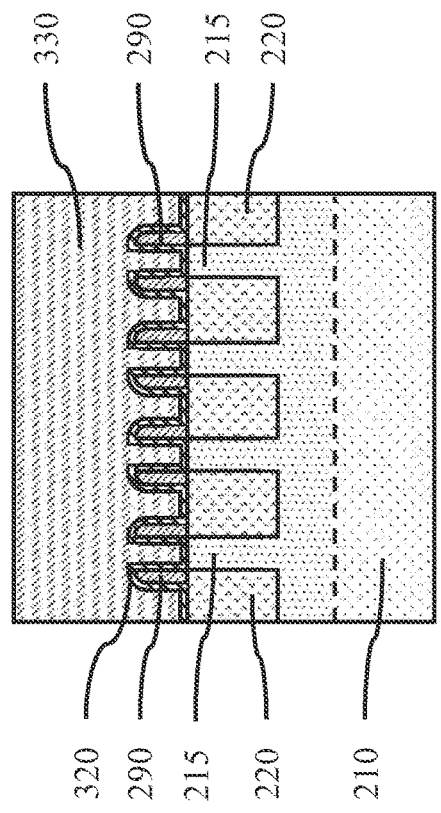
FIG. 31 is a cross-sectional side view along the E-E direction showing the blocking layer on the nanosheet sidewalls in the well contact region, in accordance with an embodiment of the present invention.

FIG. 31 is a cross-sectional side view along the E-E direction showing the blocking layer on the nanosheet sidewalls in the well contact region, in accordance with an embodiment of the present invention.

In one or more embodiments, the blocking layer 330 can be on the gate spacers 290 and protective liner 320 in the well contact region 160.

FIG. 32 is a cross-sectional side view along the A-A direction showing source/drains formed on the dielectric insulating layer between the nanosheet channels and gate structures, in accordance with an embodiment of the present invention.

In one or more embodiments, source/drains 340 can be formed on the dielectric insulating layer 230 and between the nanosheet channels 252 beneath the gate structures, where the source/drains 340 can be epitaxially grown from the exposed surfaces of the nanosheet channels 252.

In various embodiments, the source/drains 340 can be a suitably doped semiconductor material, for example, silicon (Si) or silicon germanium (SiGe), to form an n-type device or a p-type device. The source/drains 340 may be doped with a dopant type (i.e., n or p) the opposite from the dopant type of an underlying doped well region 215. For FETs and ESD it is opposite. For well contacts the dopant type is the same as the doped well region.

FIG. 33 is a cross-sectional side view along the B-B direction showing the source/drain on the dielectric insulating layer and nanosheet sidewalls, in accordance with an embodiment of the present invention.

In one or more embodiments, source/drains 340 can be formed on the dielectric insulating layer 230 and between the gate spacer 290. A portion of the source/drains 340 can extend over the gate spacer 290.

FIG. 34 is a cross-sectional side view along the C-C direction showing a source/drain formed between the nanosheet channels and gate structures in the electrostatic discharge regions, in accordance with an embodiment of the present invention.

In one or more embodiments, source/drains 340 can be formed on the doped well region 215 of the substrate 210 and between the nanosheet channels 252 beneath the gate structures, where the source/drains 340 can be epitaxially grown from the exposed surfaces of the nanosheet channels 252 as well as the exposed surface of the doped well region 215 of the substrate 210. The source/drains 340 can be n-doped or p-doped.

In one or more embodiments, a blocking layer 330 can be removed from over the dummy gate structures in the well contact region 160, where the protective liner 320 can be on the dummy gate structures and substrate surface in the well contact region 160.

FIG. 35 is a cross-sectional side view along the D-D direction showing the source/drains formed on the nanosheet sidewalls in the electrostatic discharge region, in accordance with an embodiment of the present invention.

In one or more embodiments, source/drains 340 can be formed on the dielectric insulating layer 230 and between the gate spacer 290. A portion of the source/drains 340 can extend over the gate spacer 290.

FIG. 36 is a cross-sectional side view along the E-E direction showing the protective liner on the nanosheet sidewalls in the well contact region, in accordance with an embodiment of the present invention.

In one or more embodiments, the blocking layer 330 can be removed from the gate spacers 290 and protective liner 320 in the well contact region 160.

Figure 37:
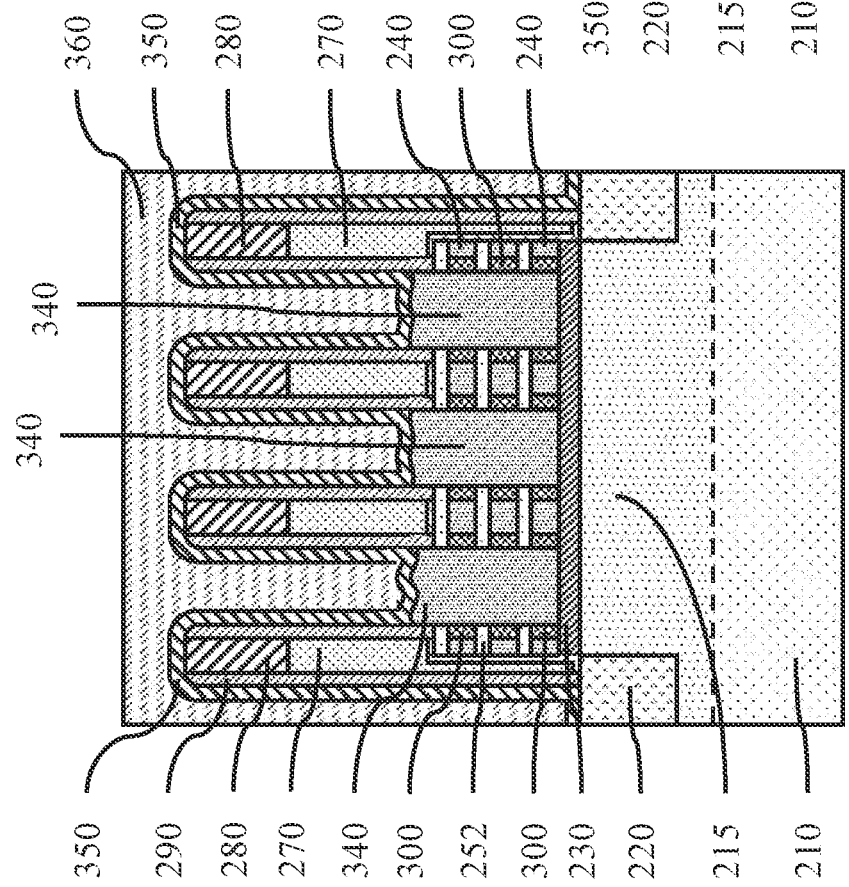
FIG. 37 is a cross-sectional side view along the A-A direction showing an insulating liner formed on the source/drains and gate structures, and a cover layer formed on the insulating liner, in accordance with an embodiment of the present invention.

FIG. 37 is a cross-sectional side view along the A-A direction showing an insulating liner formed on the source/drains and gate structures, and a cover layer formed on the insulating liner, in accordance with an embodiment of the present invention.

In one or more embodiments, an insulating liner 350 can be formed on the source/drains 340 and the gate structures, where the insulating liner 350 can be formed by a conformal deposition.

In various embodiments, the insulating liner 350 can be an electrically insulating dielectric material, including, but not limited to, silicon nitride (SiN), aluminum oxide (AlO), and combinations thereof.

In various embodiments, the insulating liner 350 can have a thickness in a range of about 0.5 nm to about 10 nm, or about 2 nm to about 6 nm, although other thicknesses are also contemplated.

In one or more embodiments, a cover layer 360 can be formed on the insulating liner 350, where the cover layer can be an OPL layer.

Figure 38:
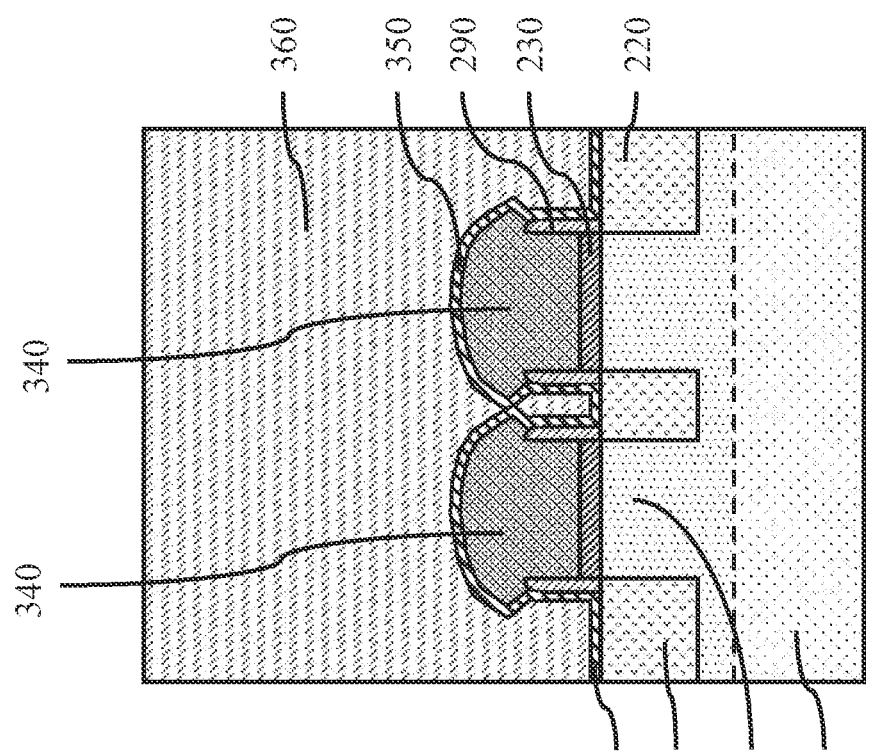
FIG. 38 is a cross-sectional side view along the B-B direction showing the insulating liner formed on the source/drains and nanosheet sidewalls, and the cover layer formed on the insulating liner, in accordance with an embodiment of the present invention.

FIG. 38 is a cross-sectional side view along the B-B direction showing the insulating liner formed on the source/drains and nanosheet sidewalls, and the cover layer formed on the insulating liner, in accordance with an embodiment of the present invention.

In one or more embodiments, an insulating liner 350 can be formed on the source/drains 340 and the electrical isolation regions 220, where the insulating liner 350 can be formed by a conformal deposition.

In one or more embodiments, a cover layer 360 can be formed on the insulating liner 350.

FIG. 39 is a cross-sectional side view along the C-C direction showing the cover layer and insulating liner on the source/drains in the electrostatic discharge regions and removed from the gate structures in the well contact region, in accordance with an embodiment of the present invention.

In one or more embodiments, a cover layer 380 can be formed over the insulating liner 350 and the dummy gate structures in the in the electrostatic discharge regions 150, while the dummy gate structures in the well contact regions 160 remain exposed.

In one or more embodiments, the cover layer 380 can be an OPL layer.

FIG. 40 is a cross-sectional side view along the D-D direction showing the cover layer and insulating liner on the source/drains in the electrostatic discharge regions, in accordance with an embodiment of the present invention.

In one or more embodiments, an insulating liner 350 can be formed on the source/drains 340 and the electrical isolation regions 220 in the electrostatic discharge regions, where the insulating liner 350 can be formed by a conformal deposition.

FIG. 41 is a cross-sectional side view along the E-E direction showing the protective liner removed from the nanosheet sidewalls in the well contact region, in accordance with an embodiment of the present invention.

In one or more embodiments, the protective liner 350 can be removed from the gate spacers 290 in the well contact region 160.

FIG. 42 is a cross-sectional side view along the A-A direction showing the insulating liner on the source/drains and gate structures after removing the cover layer, in accordance with an embodiment of the present invention.

In one or more embodiments, the cover layer 360 can be removed from the insulating liner 350 and the gate structures.

FIG. 43 is a cross-sectional side view along the B-B direction showing the insulating liner on the source/drains and nanosheet sidewalls, after removing the cover layer, in accordance with an embodiment of the present invention.

In one or more embodiments, the cover layer 360 can be removed from the insulating liner 350 on source/drains 340.

FIG. 44 is a cross-sectional side view along the C-C direction showing a source/drain formed between the nano sheet channels and gate structures in the well contact regions, in accordance with an embodiment of the present invention.

In one or more embodiments, source/drain 390 can be formed on the doped well region 215 of the substrate 210 and between the nanosheet channels 252 beneath the gate structures in the well contact region 160, where the source/drains 390 can be epitaxially grown from the exposed surfaces of the nanosheet channels 252.

In various embodiments, source/drains 390 can be n-doped or p-doped, where the doping type of the source/drain 390 can be opposite the source/drains 340 in the ESD regions 150 and the same type as the underlying doped well region 215.

In one or more embodiments, the cover layer 380 can be removed from over the dummy gate structures in the ESD regions 150.

FIG. 45 is a cross-sectional side view along the D-D direction showing the source/drains between the nanosheet channels and gate structures in the electrostatic discharge regions, in accordance with an embodiment of the present invention.

In one or more embodiments, the cover layer 380 can be removed from the insulating liner 350 and source/drains 340 in the ESD regions 150.

FIG. 46 is a cross-sectional side view along the E-E direction showing the source/drains between the nanosheet channels and gate structures in the well contact region, in accordance with an embodiment of the present invention.

In one or more embodiments, source/drains 390 can be formed on the doped well regions 215 and between the gate spacer 290 in the well contact region 160. A portion of the well contact source/drains 390 can extend over the gate spacer 290.

Figures 47, 48:
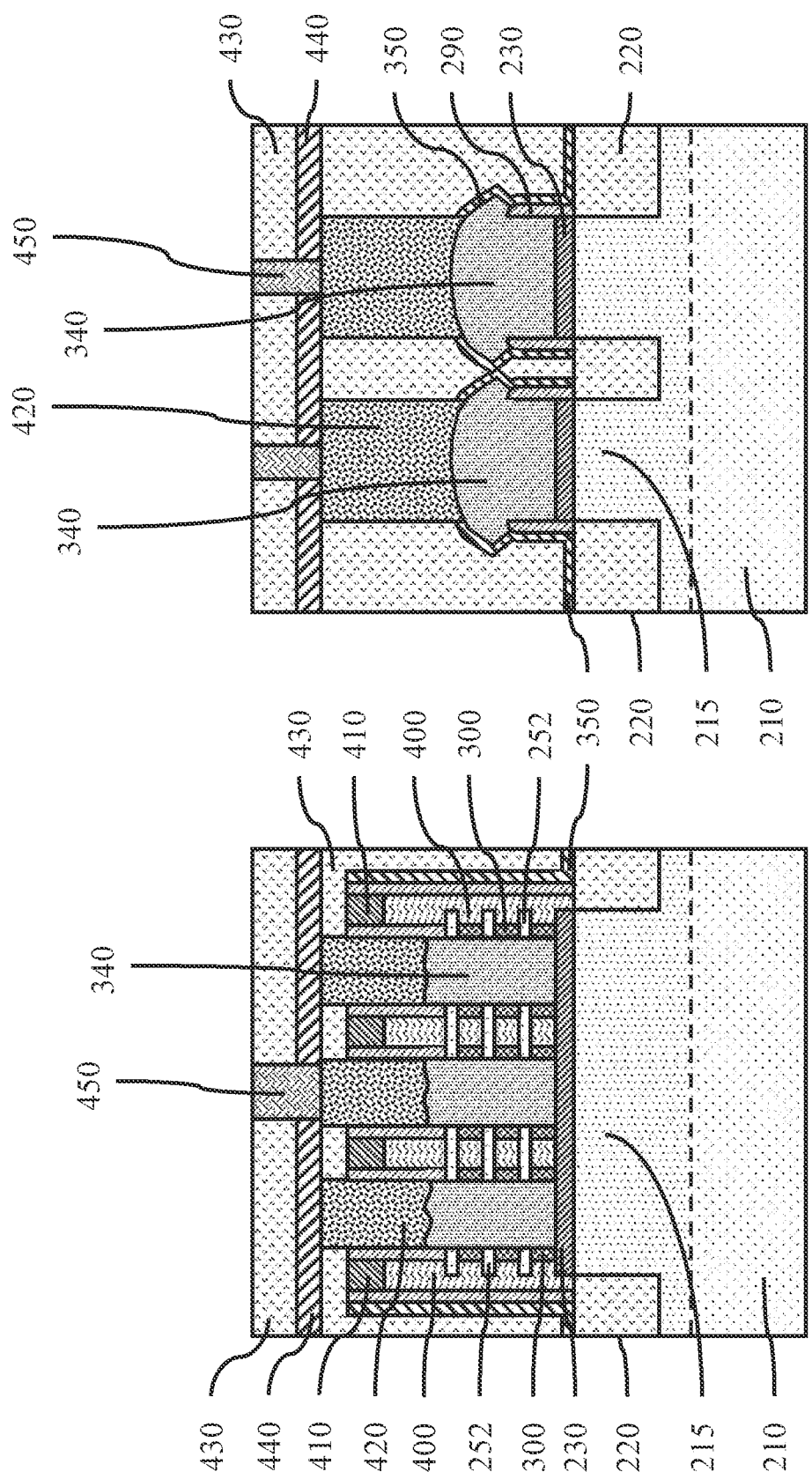
FIG. 47 is a cross-sectional side view along the A-A direction showing formation of source/drain contacts in an interlayer dielectric layer, in accordance with an embodiment of the present invention.
FIG. 48 is a cross-sectional side view along the B-B direction showing the source/drain contacts in an interlayer dielectric layer to the source/drains, in accordance with an embodiment of the present invention.

FIG. 47 is a cross-sectional side view along the A-A direction showing formation of source/drain contacts in an interlayer dielectric layer, in accordance with an embodiment of the present invention.

In one or more embodiments, the dummy gate 270 of the dummy gate structures can be removed with a selective etch, and an active gate 400 can be formed on the nanosheet channels 252, where the active gate 400 can include a gate dielectric layer on the nanosheet channels 252 and a conductive gate electrode on the gate dielectric layer. The conductive gate electrode can include a work function material layer and/or a gate metal layer. A gate cap 410 can be formed on the active gate 400. In various embodiments, the gate metal layer can be, for example, tungsten (W), cobalt (Co), ruthenium (Ru), and combinations thereof, and the work function material layer can be a metal compound, for example, tantalum nitride (TaN), titanium nitride (TiN), tantalum carbide (TaC), titanium carbide (TiC), and combinations thereof.

In one or more embodiments, an interlayer dielectric (ILD) layer 430 can be formed on the gate structures and source/drains 340.

In one or more embodiments, a trench metal contact 420 can be formed through the ILD layer 430 to the source/drains 340.

In one or more embodiments, a screening layer 440 can be formed in the ILD layer 430, where the screening layer 440 can be an electrically insulating dielectric material, including, but not limited to, silicon oxide (SiO), silicon nitride (SiN), silicon oxynitride (SiON), silicon carbide (SiC), silicon oxycarbide (SiOC), silicon carbonitride (SiCN), silicon boro carbonitride (SiBCN), silicon oxy carbonitride (SiOCN), and combinations thereof. The screening layer 440 can be a different dielectric material from the ILD layer 430.

In one or more embodiments, a Middle Of the Line (MOL) vias 450 can be formed to the trench metal contact 420 through the ILD layer 430 and the screening layer 440. In various embodiments, the Middle Of the Line (MOL) vias 450 can be, for example, copper (Cu), tungsten (W), cobalt (Co), ruthenium (Ru), molybdenum (Mo), and combinations thereof. In various embodiments, the Middle Of the Line (MOL) vias 450 can be multilayered, including a thin (1 nm-3 nm) diffusion barrier layer of titanium (Ti)/titanium nitride (TiN), and a conducting fill of metal, for example, copper (Cu), tungsten (W), cobalt (Co), ruthenium (Ru), molybdenum (Mo), and combinations thereof.

FIG. 48 is a cross-sectional side view along the B-B direction showing the source/drain contacts in an interlayer dielectric layer to the source/drains, in accordance with an embodiment of the present invention.

In one or more embodiments, an interlayer dielectric (ILD) layer 430 can be formed on the source/drains 340, where the trench metal contact 420 can be formed through the ILD layer 430 to the source/drains 340.

Figure 49:
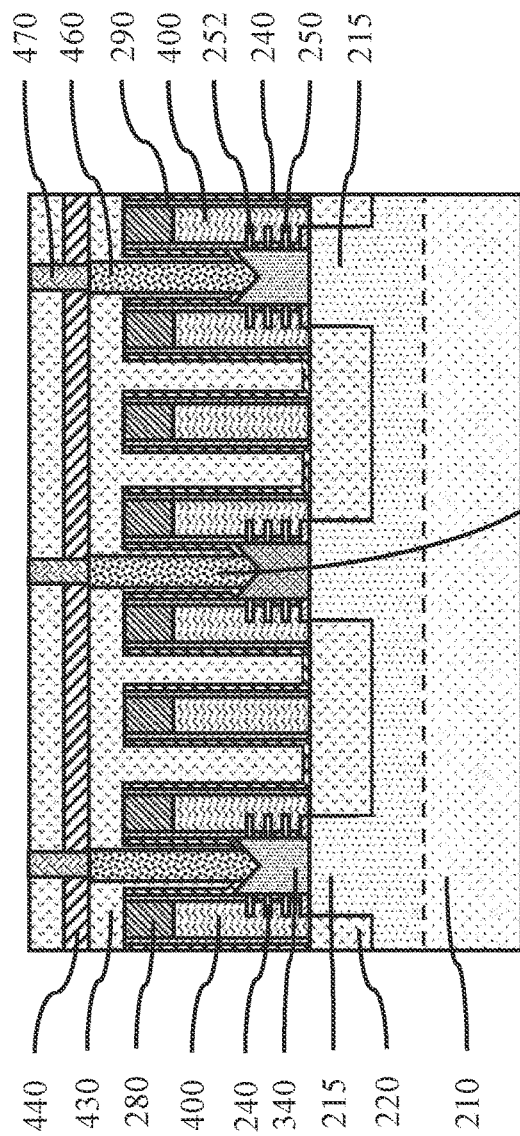
FIG. 49 is a cross-sectional side view along the C-C direction showing formation of source/drain contacts in an interlayer dielectric layer in the electrostatic discharge regions and well contact region, in accordance with an embodiment of the present invention.

FIG. 49 is a cross-sectional side view along the C-C direction showing formation of source/drain contacts in an interlayer dielectric layer in the electrostatic discharge regions and well contact region, in accordance with an embodiment of the present invention.

In one or more embodiments, the dummy gate 270 of the dummy gate structures can be removed with a selective etch, and an active gate 400 can be formed on the nanosheet channels 252, where the active gate 400 can include a gate dielectric layer on the nanosheet channels 252 and a conductive gate electrode on the gate dielectric layer. The conductive gate electrode can include a work function material layer and/or a gate metal layer. A gate cap 410 can be formed on the active gate 400.

In one or more embodiments, an interlayer dielectric (ILD) layer 430 can be formed on the gate structures and source/drains 340.

In one or more embodiments, a trench metal contacts 460, 480 can be formed through the ILD layer 430 to the source/drains 340.

In one or more embodiments, a screening layer 440 can be formed in the ILD layer 430.

In one or more embodiments, a Middle Of the Line (MOL) vias 470 can be formed to the trench metal contacts 460, 480 through the ILD layer 430 and the screening layer 440. In one or more embodiments, a Middle Of the Line (MOL) vias 470 can be formed to the trench metal contact 460 through the ILD layer 430 and the screening layer 440.

In various embodiments, the Middle Of the Line (MOL) vias 470 can be, for example, copper (Cu), tungsten (W), cobalt (Co), ruthenium (Ru), molybdenum (Mo), and combinations thereof. In various embodiments, the Middle Of the Line (MOL) vias 470 can be multilayered, including a thin (1 nm-3 nm) diffusion barrier layer of titanium (Ti)/titanium nitride (TiN), and a conducting fill of metal, for example, copper (Cu), tungsten (W), cobalt (Co), ruthenium (Ru), molybdenum (Mo), and combinations thereof.

Figure 50:
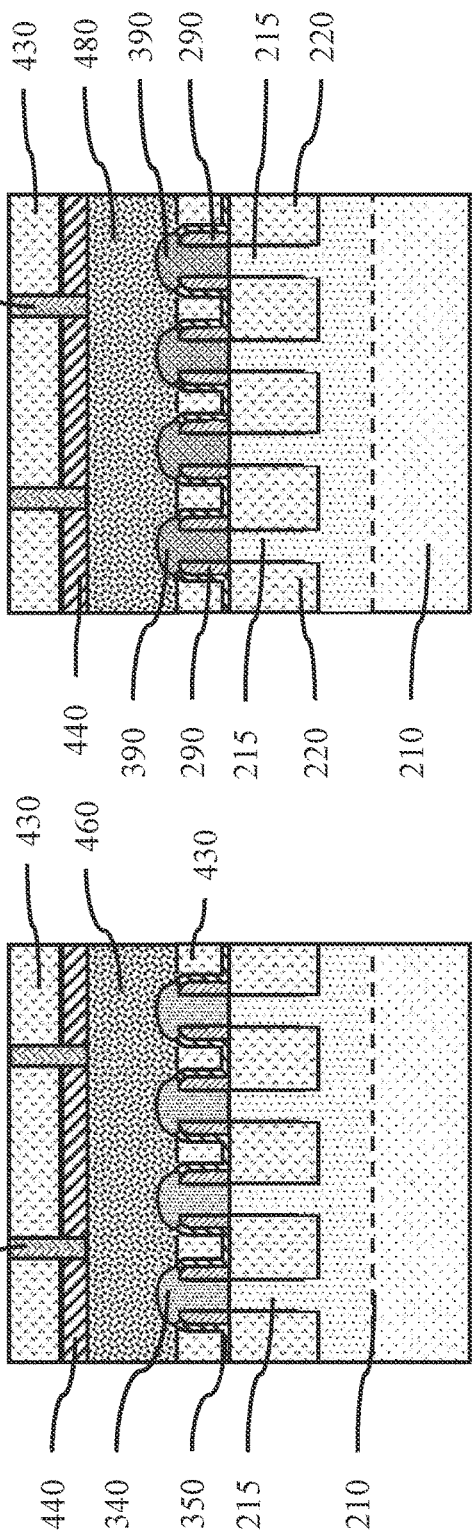
FIG. 50 is a cross-sectional side view along the D-D direction showing the source/drain contacts in an interlayer dielectric layer to the source/drains in the electrostatic discharge regions, in accordance with an embodiment of the present invention.

FIG. 50 is a cross-sectional side view along the D-D direction showing the source/drain contacts in an interlayer dielectric layer to the source/drains in the electrostatic discharge regions, in accordance with an embodiment of the present invention.

In one or more embodiments, a trench metal contact 460 can be formed to the source/drains 340 in the ESD regions 150.

Figure 51:
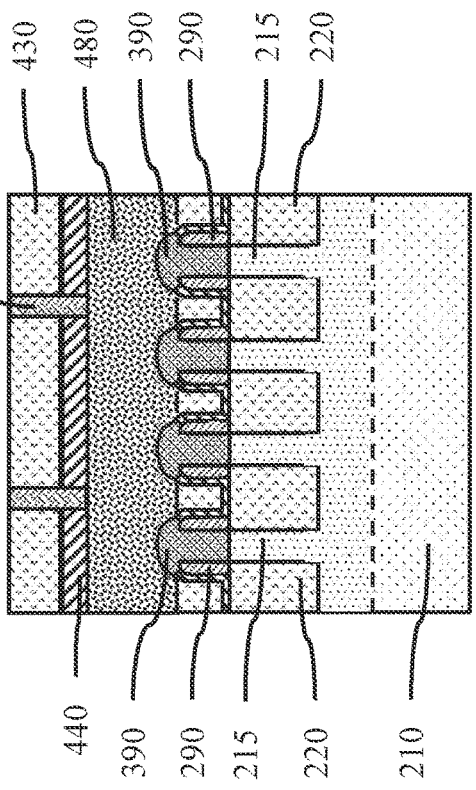
FIG. 51 is a cross-sectional side view along the E-E direction showing the source/drain contacts in an interlayer dielectric layer to the source/drains in the well contact region, in accordance with an embodiment of the present invention.

FIG. 51 is a cross-sectional side view along the E-E direction showing the source/drain contacts in an interlayer dielectric layer to the source/drains in the well contact region, in accordance with an embodiment of the present invention.

In one or more embodiments, a trench metal contact 480 can be formed to the source/drains 340 in the ESD regions 150.

In one or more embodiments, a Middle Of the Line (MOL) vias 490 can be formed to the source/drain contact 480 through the ILD layer 430 and the screening layer 440 in the well contact region 160. In various embodiments, the Middle Of the Line (MOL) vias 490 can be, for example, copper (Cu), tungsten (W), cobalt (Co), ruthenium (Ru), molybdenum (Mo), and combinations thereof. In various embodiments, the Middle Of the Line (MOL) vias 490 can be multilayered, including a thin (1 nm-3 nm) diffusion barrier layer of titanium (Ti)/titanium nitride (TiN), and a conducting fill of metal, for example, copper (Cu), tungsten (W), cobalt (Co), ruthenium (Ru), molybdenum (Mo), and combinations thereof.

Figures 52, 53:
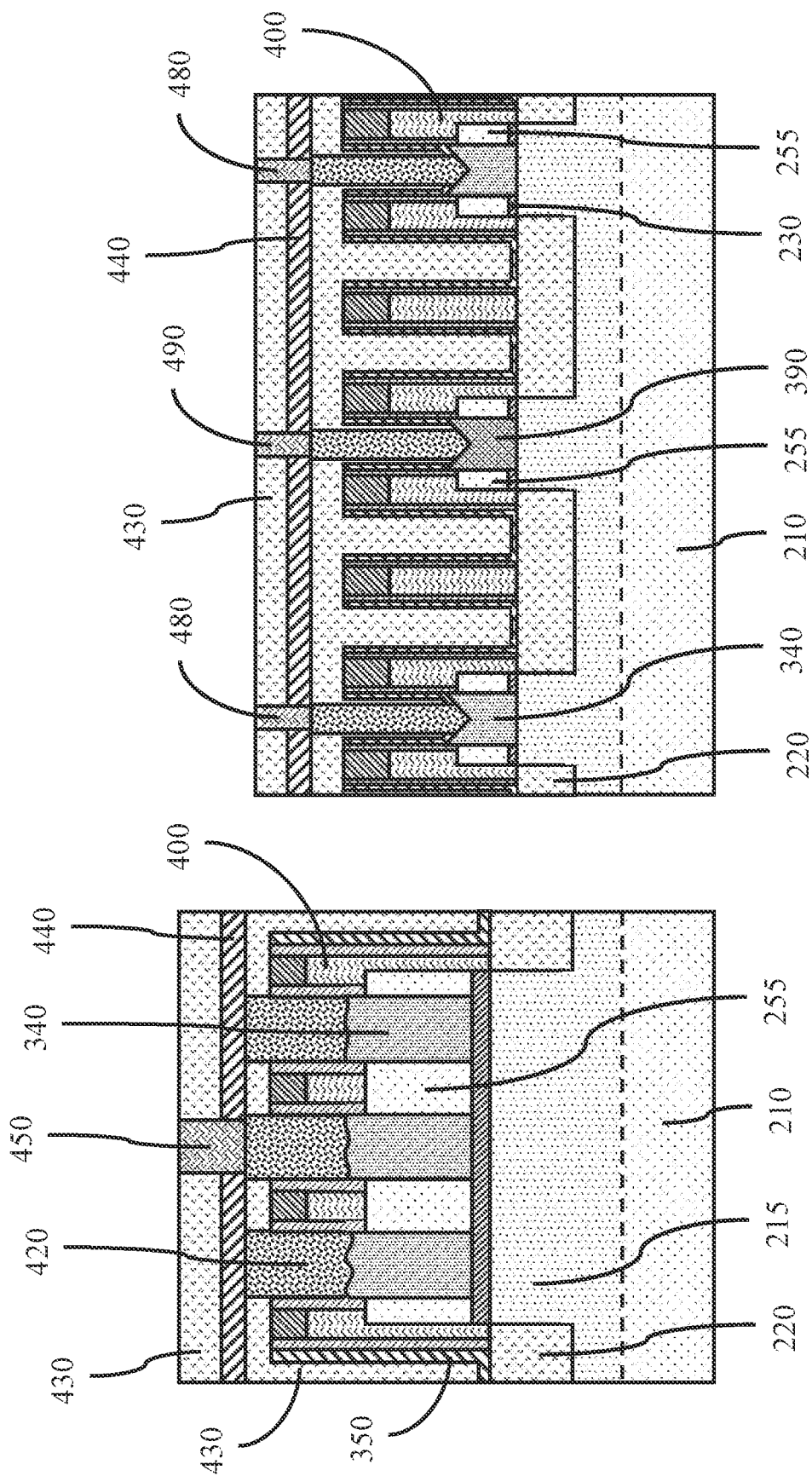
FIG. 52 is a cross-sectional side view along the A-A direction showing fins in place of the nanosheet channels, in accordance with another embodiment of the present invention.
FIG. 53 is a cross-sectional side view along the C-C direction showing the source/drain contacts in an interlayer dielectric layer in the electrostatic discharge regions and well contact region, with fins in place of the nanosheet channels, in accordance with another embodiment of the present invention.

FIG. 52 is a cross-sectional side view along the A-A direction showing fins in place of the nanosheet channels, in accordance with another embodiment of the present invention.

In one or more embodiments, the device channels can be formed by vertical fins 255 in place of the nanosheet channels 252 by forming a single semiconducting channel layer rather than a stack of nanosheets. In various embodiments, the vertical fins 255 can be separated from the underlying well region 215 by the bottom dielectric insulating layer 230.

FIG. 53 is a cross-sectional side view along the C-C direction showing the source/drain contacts in an interlayer dielectric layer in the electrostatic discharge regions and well contact region, with fins in place of the nanosheet channels, in accordance with another embodiment of the present invention.

In one or more embodiments, the device channels can be formed by vertical fins 255 in place of the nanosheet channels 252 by forming a single semiconducting channel layer rather than a stack of nanosheets. In various embodiments, the vertical fins 255 can be separated from the underlying well region 215 by the bottom dielectric insulating layer 230.

In one or more embodiments, the device channels can be formed by vertical fins 255 in place of the nanosheet channels 252 by forming a single semiconducting channel layer rather than a stack of nanosheets.

Figures 54, 55:
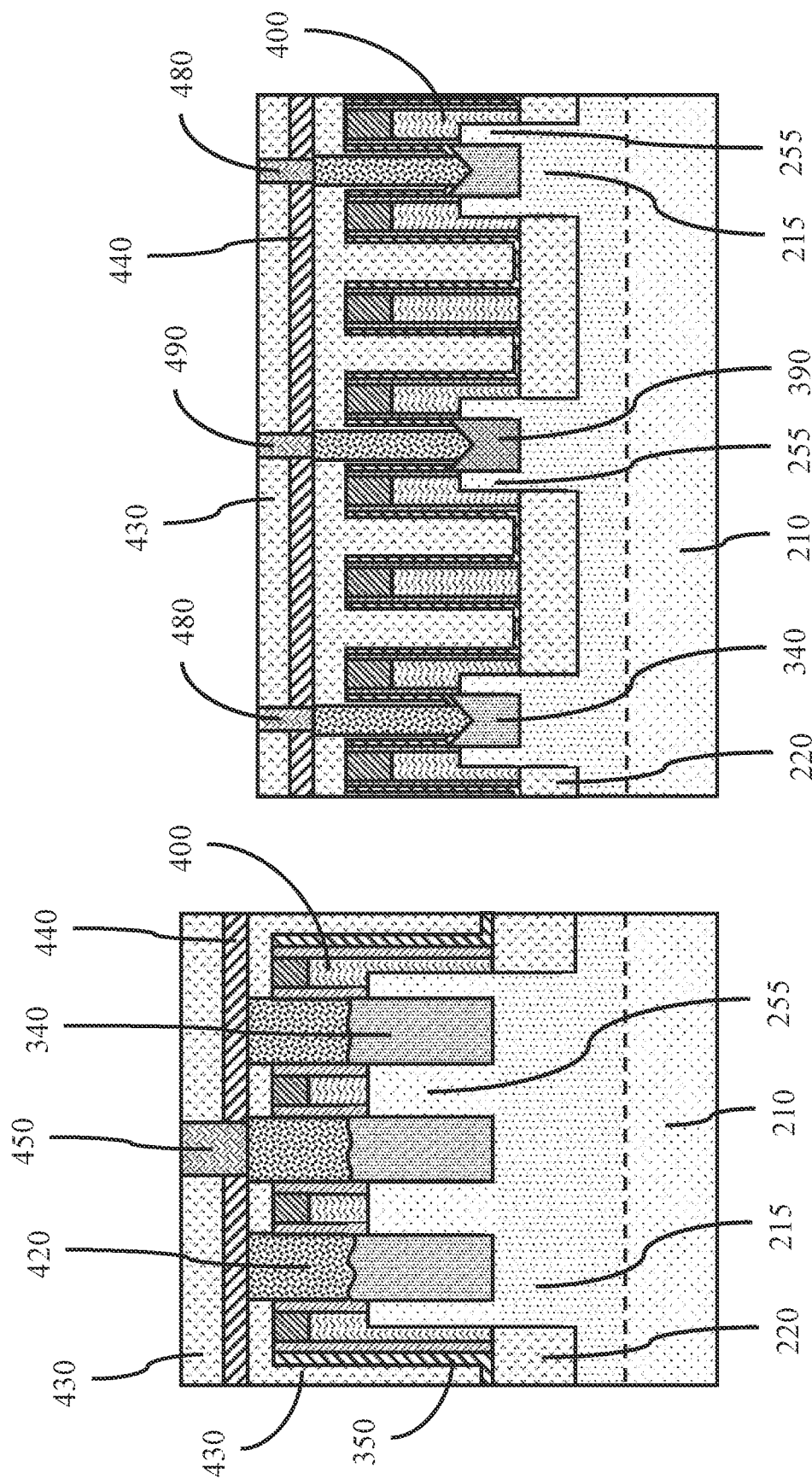
FIG. 54 is a cross-sectional side view along the A-A direction showing fins in place of the nanosheet channels, and without a dielectric insulating layer, in accordance with another embodiment of the present invention.
FIG. 55 is a cross-sectional side view along the C-C direction showing the source/drain contacts in an interlayer dielectric layer in the electrostatic discharge regions and well contact region, with fins in place of the nanosheet channels, and without a dielectric insulating layer in the regions, in accordance with another embodiment of the present invention.

FIG. 54 is a cross-sectional side view along the A-A direction showing fins in place of the nanosheet channels, and without a dielectric insulating layer, in accordance with another embodiment of the present invention.

In one or more embodiments, the device channels can be formed by vertical fins 255 in place of the nanosheet channels 252 by forming a single semiconducting channel layer rather than a stack of nanosheets. In various embodiments, the vertical fins 255 can be on the underlying well region 215 without an intervening the bottom dielectric insulating layer 230.

FIG. 55 is a cross-sectional side view along the C-C direction showing the source/drain contacts in an interlayer dielectric layer in the electrostatic discharge regions and well contact region, with fins in place of the nanosheet channels, and without a dielectric insulating layer in the regions, in accordance with another embodiment of the present invention.

In one or more embodiments, the device channels can be formed by vertical fins 255 in place of the nanosheet channels 252 by forming a single semiconducting channel layer rather than a stack of nanosheets. In various embodiments, the vertical fins 255 can be on the underlying well region 215 without an intervening the bottom dielectric insulating layer 230.

Figure 56:
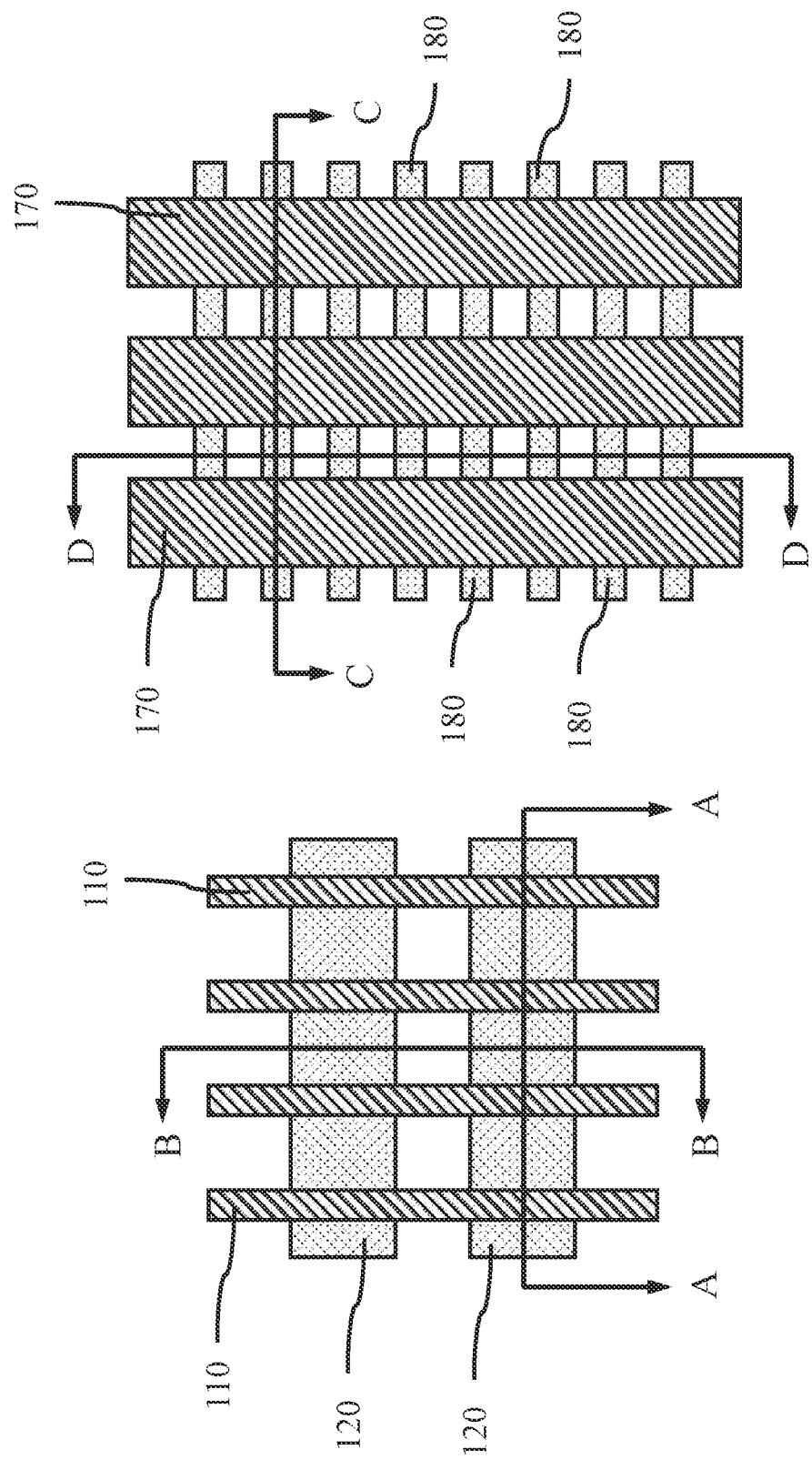
FIG. 56 is a top view showing a logic region and a capacitor (CAP) region, in accordance with an embodiment of the present invention.

FIG. 56 is a top view showing a logic region and a capacitor (CAP) region, in accordance with an embodiment of the present invention.

In one or more embodiments, a plurality of gate structures 110 can be formed over a plurality of nanosheet channel stacks 120 in a nanosheet device region, which can form logic devices. In various embodiments, a plurality of nanosheet device stacks 180 can be formed across one or more capacitor (CAP) device region(s), where the CAP can be an n-type capacitor (NCAP) exhibiting an n-type gate on an n-well, or a p-type capacitor (PCAP) exhibiting a p-type gate on a p-well. One or more gate structures 170 can be formed over the plurality of nanosheet device stacks 170 in the CAP device region(s). The nanosheet device region and the NCAP and/or PCAP device region(s) can be on the same substrate, where the nanosheet device region and CAP device region(s) can be adjacent to each other.

FIG. 57 is a cross-sectional side view along the C-C direction showing gate structures on the nanosheet stack, with the dielectric insulating layer in the regions, in accordance with another embodiment of the present invention.

In one or more embodiments, the nanosheet devices in the CAP device region(s) can be formed from a nanosheet stack of alternating sacrificial nanosheet layers 240 and nanosheet channel layers 250 formed on a substrate 210. A bottom dielectric insulating layer 230 can be formed on the substrate 210, where the bottom dielectric insulating layer 230 can be between the substrate 210 and the stack of alternating sacrificial nanosheet layers 240 and nanosheet channel layers 250. One or more electrical isolation regions 220 can be formed in the substrate 210, where the electrical isolation regions 220 be on opposite sides of the nanosheet stack.

In one or more embodiments, a plurality of dummy gate structures can be formed on the nanosheet stack, where each of the dummy gate structures can include a dummy gate 270 on the nanosheet stack, a dummy gate hardmask 280 on the dummy gate 270, and a gate spacer 290 formed over the dummy gate hardmask 280 and the dummy gate 270.

In various embodiments, a dummy gate dielectric 260 can cover the nanosheet stack, where the dummy gate dielectric 260 can be tween the dummy gate 270 and a top most nanosheet channel layer 250. The gate spacer 290 can be on the top most nanosheet channel layer 250.

FIG. 58 is a cross-sectional side view along the D-D direction showing the nanosheet stack, in accordance with another embodiment of the present invention.

In one or more embodiments, the nanosheet devices in the NCAP device region(s) and/or PCAP device region(s) can be formed from a nanosheet stack of alternating sacrificial nanosheet layers 240 and nanosheet channel layers 250 formed on a substrate 210. A bottom dielectric insulating layer 230 can be formed on the substrate 210, where the bottom dielectric insulating layer 230 can be between the substrate 210 and the stack of alternating sacrificial nanosheet layers 240 and nanosheet channel layers 250. One or more electrical isolation regions 220 can be formed in the substrate 210, where the electrical isolation regions 220 be on opposite sides of the nanosheet stack.

In various embodiments, a gate spacer 290 can cover the nanosheet stack, where the gate spacer 290 can be between the dummy gates 270. The gate spacer 290 can be on the top most nanosheet channel layer 250.

FIG. 59 is a cross-sectional side view along the C-C direction showing a final structure for the nanosheet devices in the CAP region, in accordance with another embodiment of the present invention.

In one or more embodiments, the dummy gate 270 of the dummy gate structures can be removed with a selective etch, and an active gate 510 can be formed on the nanosheet channels 252, where the active gate 510 can include a gate dielectric layer on the nanosheet channels 252 and a conductive gate electrode on the gate dielectric layer. The conductive gate electrode can include a work function material layer and/or a gate metal layer. A gate cap 520 can be formed on the active gate 510. In various embodiments, the gate metal layer can be, for example, tungsten (W), cobalt (Co), ruthenium (Ru), and combinations thereof, and the work function material layer can be a metal compound, for example, tantalum nitride (TaN), titanium nitride (TiN), tantalum carbide (TaC), titanium carbide (TiC), and combinations thereof.

In one or more embodiments, an interlayer dielectric (ILD) layer 430 can be formed on the gate structures and source/drains 500.

In one or more embodiments, a trench metal contact 530 can be formed through the ILD layer 430 to the source/drains 500.

In one or more embodiments, a screening layer 440 can be formed in the ILD layer 430.

In one or more embodiments, a Middle Of the Line (MOL) vias 540 can be formed to the trench metal contact 530 through the ILD layer 430 and the screening layer 440. In various embodiments, the Middle Of the Line (MOL) vias 540 can be, for example, copper (Cu), tungsten (W), cobalt (Co), ruthenium (Ru), molybdenum (Mo), and combinations thereof. In various embodiments, the Middle Of the Line (MOL) vias 540 can be multilayered, including a thin (1 nm-3 nm) diffusion barrier layer of titanium (Ti)/titanium nitride (TiN), and a conducting fill of metal, for example, copper (Cu), tungsten (W), cobalt (Co), ruthenium (Ru), molybdenum (Mo), and combinations thereof.

FIG. 60 is a cross-sectional side view along the D-D direction showing a final structure for the nanosheet devices in the CAP region, in accordance with another embodiment of the present invention.

In one or more embodiments, a Middle Of the Line (MOL) vias 540 can be formed to the trench metal contact 530 through the ILD layer 430 and the screening layer 440. In various embodiments, the Middle Of the Line (MOL) vias 540 can be, for example, copper (Cu), tungsten (W), cobalt (Co), ruthenium (Ru), molybdenum (Mo), and combinations thereof. The trench metal contact 530 can be formed on the source/drains 500.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, Operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of devices and method of fabricating the devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a first field effect device on a first region of a substrate, wherein a gate structure and a first source/drain of the first field effect device are separated from the substrate by a bottom dielectric layer; and
   an electrostatic discharge device on a second region of the substrate, wherein a gate structure for the electrostatic discharge device is separated from the substrate by the bottom dielectric layer, and a source/drain for the electrostatic discharge device is in electrical contact with the substrate, wherein the source/drain for the electrostatic discharge device is doped with a second dopant type.

2. The semiconductor device of claim 1, further comprising a first doped well region in the substrate beneath the source/drain of the electrostatic discharge device, wherein the first doped well region is doped with a first dopant type.

3. The semiconductor device of claim 2, wherein the first dopant type is the opposite dopant type from the second dopant type.

4. The semiconductor device of claim 3, further comprising a well contact device on a third region of the substrate adjacent to the second region of the substrate, wherein the well contact device includes a source/drain, and wherein the source/drain is doped with a third dopant type.

5. The semiconductor device of claim 4, further comprising a second doped well region in the substrate beneath the third source/drain of the well contact device, wherein the second doped well region is doped with a fourth dopant type, and wherein the fourth dopant type is the same do ant type as the third dopant type.

6. The semiconductor device of claim 5, wherein a device channel of the first field effect device formed by a first set of one or more nanosheets.

7. The semiconductor device of claim 5, wherein a device channel of the first field effect device is formed by a first vertical fin.

8. The semiconductor device of claim 5, wherein a device channel of the electrostatic discharge device of formed by a second set of one or more nanosheets, and a device channel of the well contact device is formed by a third set of one or more nanosheets.

9. The semiconductor device of claim 5, wherein of the electrostatic discharge device is formed by a second vertical fin, and a device channel of the well contact device is formed by a third vertical fin.

\* \* \* \* \*